United States Patent
Hokazono et al.

(10) Patent No.: US 10,389,227 B2
(45) Date of Patent: Aug. 20, 2019

(54) SEMICONDUCTOR DEVICE DRIVE CIRCUIT AND INVERTER DEVICE WITH DESATURATION DETECTION

(71) Applicant: Mitsubishi Electric Corporation, Tokyo (JP)

(72) Inventors: Kazuya Hokazono, Tokyo (JP); Akihisa Yamamoto, Tokyo (JP); Dong Wang, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/740,898

(22) PCT Filed: Oct. 19, 2015

(86) PCT No.: PCT/JP2015/079451
§ 371 (c)(1),
(2) Date: Dec. 29, 2017

(87) PCT Pub. No.: WO2017/068626
PCT Pub. Date: Apr. 27, 2017

(65) Prior Publication Data
US 2018/0191239 A1    Jul. 5, 2018

(51) Int. Cl.
*H02M 1/32*     (2007.01)
*H02M 1/08*     (2006.01)
(Continued)

(52) U.S. Cl.
CPC .............. *H02M 1/32* (2013.01); *H02M 1/08* (2013.01); *H02M 7/003* (2013.01); *H02M 7/537* (2013.01);
(Continued)

(58) Field of Classification Search
CPC .......... H02M 1/08; H02M 1/32; H02M 7/537; H02M 7/003; H02M 7/538;
(Continued)

(56) References Cited

U.S. PATENT DOCUMENTS 5,687,049 A * 11/1997 Mangtani ............. H02H 7/1227
361/18
2014/0118874 A1* 5/2014 Kandah .............. H03K 17/0826
361/93.1
(Continued)

FOREIGN PATENT DOCUMENTS

JP    H09-233838 A    9/1997
JP    H09-247951 A    9/1997
(Continued)

OTHER PUBLICATIONS

IR2125 (IR2125, "Current Limiting Single Channel Driver," Data Sheet, International Rectifier, 2004).*
(Continued)

*Primary Examiner* — Adolf D Berhane
*Assistant Examiner* — Jye-June Lee
(74) *Attorney, Agent, or Firm* — Studebaker & Brackett PC

(57) ABSTRACT

A semiconductor device drive circuit drives a semiconductor switching device including a first electrode, a second electrode, and a control electrode. The semiconductor device drive circuit includes an input terminal that receives an input signal; a level shift unit that shifts a voltage level of the input signal and outputs a drive signal to be supplied to the control electrode; a first resistor that generates a first current from a first voltage applied to the first electrode; a second resistor that generates a second current from a second voltage applied to the second electrode; and a voltage difference determination unit that outputs a detection signal when a
(Continued)

difference between the first current and the second current is equal to or greater than a predetermined desaturation determination value. The semiconductor device drive circuit is a single integrated circuit chip.

22 Claims, 19 Drawing Sheets

(51) Int. Cl.
  *H02M 7/537* (2006.01)
  *H03K 17/0812* (2006.01)
  *H02M 7/00* (2006.01)
  *H03K 17/082* (2006.01)
  *H02M 7/538* (2007.01)
  *H02M 1/00* (2006.01)

(52) U.S. Cl.
  CPC ... *H03K 17/0828* (2013.01); *H03K 17/08122* (2013.01); *H03K 17/08128* (2013.01); *H02M 7/538* (2013.01); *H02M 2001/0009* (2013.01); *H03K 2217/0063* (2013.01)

(58) Field of Classification Search
  CPC .... H02M 2001/0009; H03K 17/08122; H03K 17/08128; H03K 17/0828; H03K 2217/0063
  See application file for complete search history.

(56) References Cited

U.S. PATENT DOCUMENTS

| | | | | |
|---|---|---|---|---|
| 2017/0122996 | A1* | 5/2017 | Sullivan | H03K 17/0828 |
| 2018/0183228 | A1* | 6/2018 | Huber | H03K 17/0828 |
| 2018/0198442 | A1* | 7/2018 | Hokazono | H03K 17/0828 |

FOREIGN PATENT DOCUMENTS

| | | |
|---|---|---|
| JP | 2011-049741 A | 3/2011 |
| JP | 2012-039293 A | 2/2012 |
| JP | 2014-217151 A | 11/2014 |

OTHER PUBLICATIONS

International Search Report issued in PCT/JP2015/079451, dated Jan. 12, 2016.
Notification of Transmittal of Translation of the International Preliminary Report on Patentability and Translation of Written Opinion of the International Searching Authority; PCT/JP2015/079451; dated May 3, 2018.
An Office Action mailed by the Japanese Patent Office dated Jul. 17, 2018, which corresponds to Japanese Patent Application No. 2017-546292 and is related to U.S. Appl. No. 15/740,898.

* cited by examiner

111 PRIMARY-SIDE SIGNAL TRANSMISSION CIRCUIT
114 SECONDARY-SIDE SIGNAL TRANSMISSION CIRCUIT
123d VOLTAGE DIFFERENCE DETERMINATION UNIT

SEMICONDUCTOR DEVICE DRIVE CIRCUIT AND INVERTER DEVICE WITH DESATURATION DETECTION

FIELD

The present invention relates to a semiconductor device drive circuit and an inverter device.

BACKGROUND

When a semiconductor switching device (e.g., an insulating gate bipolar transistor) operates in a normally ON state, a collector-emitter voltage is held in a state where the collector-emitter voltage is lowered to a saturation voltage of the semiconductor switching device. However, when the semiconductor switching device is short-circuited, the collector-emitter voltage rises from the saturation voltage due to an overcurrent. A state where the collector-emitter voltage rises to a voltage higher than the saturation voltage is also called "desaturation", and the collector-emitter voltage obtained when the semiconductor switching device is in the desaturation state is also called a "desaturation voltage" or "DESAT voltage".

As disclosed in, for example, JP H09-247951 A, a circuit device having a short-circuit protection function for a high-potential-side semiconductor switching device has been heretofore known. In JP H09-247951 A, a first resistor is provided between a drive circuit of a semiconductor device and a semiconductor switching device, and a second resistor is provided in the drive circuit. The first resistor is provided outside the drive circuit, and a voltage generated between the terminals of the semiconductor switching device is detected by a voltage that is divided by the first resistor and the second resistor provided in the drive circuit.

CITATION LIST

Patent Literature

[PTL 1] JP H09-247951 A

SUMMARY

Technical Problem

In the circuit disclosed in JP H09-247951 A described above, the short-circuit protection function by desaturation voltage detection is completed only after a high-voltage resistor is further provided outside the drive circuit of the semiconductor device. Since there is a demand for providing the drive circuit as well as other external components, a space for mounting the external components, and a wire or the like for connecting the drive circuit to the external components are required. This results in a problem that constraints in terms of design and production are generated, which inhibits miniaturization of a semiconductor apparatus.

The present invention has been made to solve the problem described above, and an object of the present invention is to provide a semiconductor device drive circuit and an inverter device which have a desaturation voltage detection function and in which constraints in terms of a device design and the like are reduced.

Further, a plurality of high-voltage resistors may be combined with the drive circuit of the semiconductor device so as to obtain the short-circuit protection function by desaturation voltage detection. However, when a plurality of high-voltage resistors is provided, an operation (pairing) for matching the characteristics between the high-voltage resistors is required, so that constraints in terms of design and production are generated.

Another object of the present invention is to provide a semiconductor device drive circuit and an inverter device which are capable of implementing the desaturation voltage detection function, while reducing a time and labor required for pairing when a plurality of resistors is used.

Solution to Problem

According to a first invention, a semiconductor device drive circuit for driving a semiconductor switching device including a first electrode, a second electrode, and a control electrode that controls an electrical connection between the first electrode and the second electrode, the semiconductor device drive circuit includes:

an input terminal that receives an input signal;

a level shift unit that shifts a voltage level of the input signal and outputs a drive signal to be supplied to the control electrode;

a first resistor that generates a first current from a first voltage applied to the first electrode;

a second resistor that generates a second current from a second voltage applied to the second electrode; and a determination unit that outputs a detection signal when a difference between the first current and the second current is equal to or greater than a predetermined desaturation determination value, wherein the level shift unit, the first resistor, the second resistor, and the determination unit are provided in a single integrated circuit chip.

According to a second invention, a semiconductor device drive circuit for driving a semiconductor switching device including a first electrode, a second electrode, and a control electrode that controls an electrical connection between the first electrode and the second electrode, the semiconductor device drive circuit includes:

an input terminal that receives an input signal;

a level shift unit that shifts a voltage level of the input signal and outputs a drive signal to be supplied to the control electrode;

a constant current circuit that generates a preliminarily set predetermined current;

a resistor that generates a detection current from a voltage applied to the second electrode; and a determination unit that outputs a detection signal when the detection current is less than the predetermined current.

According to a third invention, an inverter device includes:

a high-potential-side semiconductor switching device including a first electrode, a second electrode, and a first control electrode that controls an electrical connection between the first electrode and the second electrode;

a low-potential-side semiconductor switching device including a third electrode connected to the second electrode, a fourth electrode, and a second control electrode that controls an electrical connection between the third electrode and the fourth electrode;

a first semiconductor device drive circuit that drives the high-potential-side semiconductor switching device; and a second semiconductor device drive circuit that drives the low-potential-side semiconductor switching device, wherein the first semiconductor device drive circuit includes:

an input terminal that receives an input signal;

a level shift unit that shifts a voltage level of the input signal, and outputs a drive signal to be supplied to the first control electrode;

a first resistor that generates a first current from a first voltage applied to the first electrode;

a second resistor that generates a second current applied to the second electrode; and a determination unit configured to output a detection signal when a difference between the first current and the second current is equal to or greater than a predetermined desaturation determination value, and the level shift unit, the first resistor, the second resistor, and the determination unit are incorporated in a single integrated circuit chip.

According to a fourth invention, an inverter device includes:

a high-potential-side semiconductor switching device including a first electrode, a second electrode, and a first control electrode that controls an electrical connection between the first electrode and the second electrode;

a low-potential-side semiconductor switching device including a third electrode connected to the second electrode, a fourth electrode, and a second control electrode that controls an electrical connection between the third electrode and the fourth electrode;

a first semiconductor device drive circuit that drives the high-potential-side semiconductor switching device; and a second semiconductor device drive circuit that drives the low-potential-side semiconductor switching device, wherein the first semiconductor device drive circuit includes:

an input terminal that receives an input signal;

a level shift unit that shifts a voltage level of the input signal, and outputs a drive signal to be supplied to the first control electrode;

a constant current circuit that generates a preliminarily set predetermined current;

a resistor that generates a detection current from a voltage applied to the second electrode; and a determination unit that outputs a detection signal when the detection current is less than the predetermined current.

Advantageous Effects of Invention

According to the first and third inventions, since the resistors used for determination of a desaturation voltage are provided in an integrated circuit, the desaturation voltage can be detected by a single integrated circuit. Therefore, constraints in terms of device design and the like can be reduced as compared with a case where the resistors are provided outside the integrated circuit.

According to the second and fourth inventions, the desaturation voltage is detected by comparing a predetermined current of a constant current circuit and a detection current generated via the resistor. Therefore, a time and labor required for pairing, which is required when currents from the first and second electrodes are detected by a plurality of resistors, can be reduced.

DESCRIPTION OF EMBODIMENTS

Figure 1:
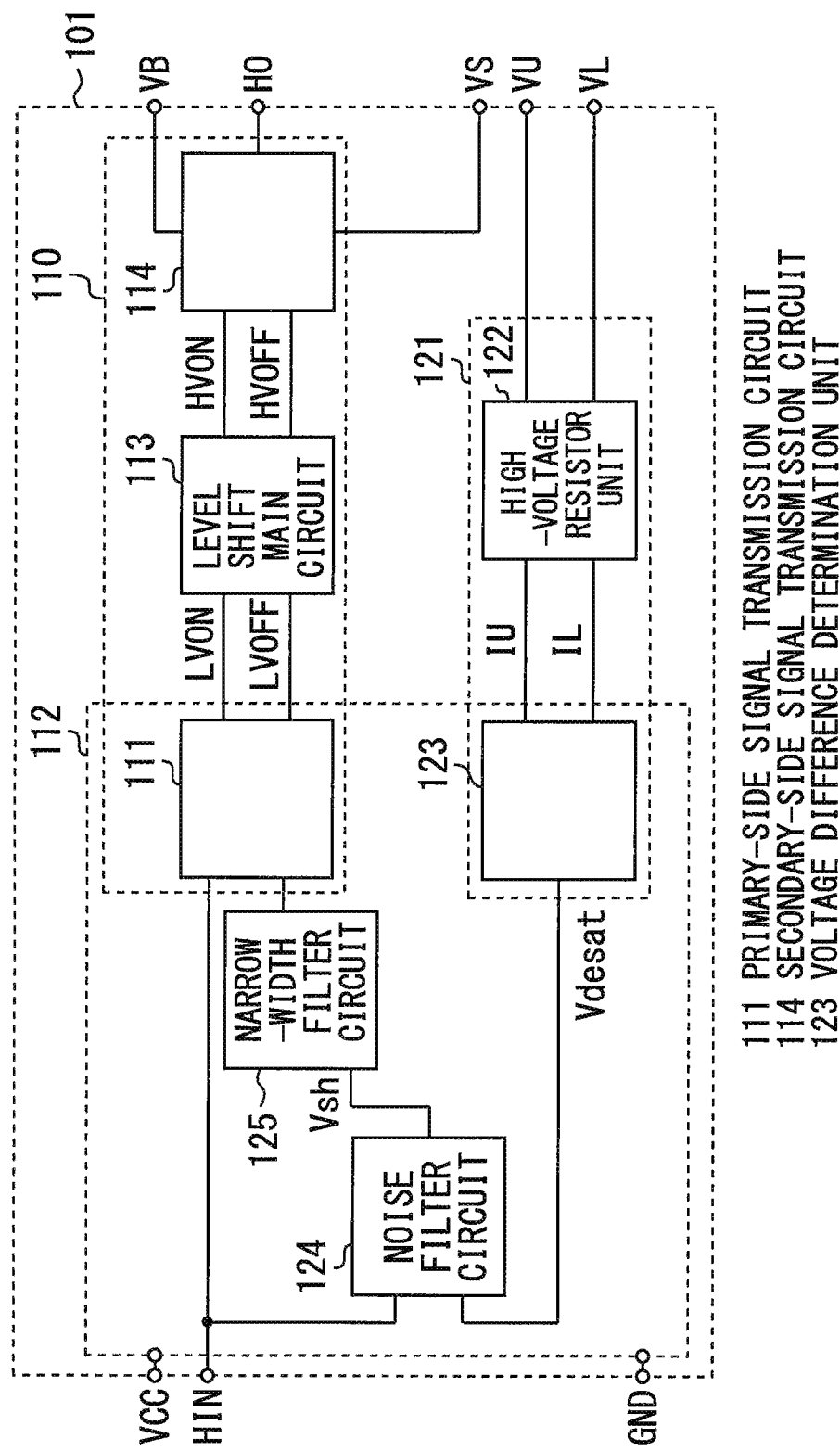
FIG. 1 is a circuit block diagram illustrating a semiconductor device driving integrated circuit according to a first embodiment of the present invention.

Semiconductor device driving integrated circuits 101 to 1016 provided as embodiments of a semiconductor device drive circuit according to the present invention will be described below. The same or corresponding components as those in the following embodiments are denoted by the same reference numerals, and the descriptions of common features may be abbreviated or omitted.

First Embodiment

FIG. 1 is a circuit block diagram illustrating a semiconductor device driving integrated circuit 101 (hereinafter also referred to simply as the integrated circuit 101) according to a first embodiment of the present invention. The integrated circuit 101 includes a level shift unit 110, a desaturation voltage detection circuit 121, a noise filter circuit 124, and a narrow-width filter circuit 125. As described later with reference to FIG. 2, the integrated circuit 101 is connected to a high-potential-side semiconductor switching device 102.

The level shift unit 110 shifts a voltage level of an input signal HIN to a high-potential-side, and outputs a drive signal HO to be supplied to a gate electrode of the high-potential-side semiconductor switching device 102. Specifically, in the level shift unit 110, a level shift main circuit 113 transmits signals LVON and LVOFF, which are generated by a primary-side signal transmission circuit 111 in synchronization with the input signal HIN, to a secondary-side signal transmission circuit 114 as signals HVON and HVOFF, and the secondary-side signal transmission circuit 114 generates the drive signal HO.

The primary-side signal transmission circuit 111 outputs first voltage level signals (LVON, LVOFF) according to the input signal HIN. Specifically, assuming that a first reference potential GND is set as a reference potential and a first power supply voltage VCC is set as a power supply voltage, the primary-side signal transmission circuit 111 receives the input signal HIN and a detection signal Vsh, which is input via the narrow-width filter circuit 125, and generates the signals LVON and LVOFF. The detection signal Vsh is a signal obtained after a detection signal Vdesat, which is described later, is filtered by the noise filter circuit 124. The detection signal Vsh and the detection signal Vdesat are described later with reference to FIG. 3. The primary-side signal transmission circuit 111 generates the signals LVON and LVOFF in synchronization with the input signal HIN when the detection signal Vsh is LOW. When the detection signal Vsh is LOW, the signal LVON rises in synchronization with a rising edge of the input signal HIN, and the signal LVOFF rises in synchronization with a falling edge of the input signal HIN. When the detection signal Vsh is high, the primary-side signal transmission circuit 111 generates the signals LVON and LVOFF in such a manner that the signal LVOFF rises and the signal LVON falls in synchronization with a rising edge of the detection signal Vsh.

The level shift main circuit 113 shifts the voltage level of the first voltage level signals (LVON, LVOFF) and generates the second voltage level signals (HVON, HVOFF). Specifically, the level shift main circuit 113 generates the signals HVON and HVOFF based on a second reference potential VS, which is different from the first reference potential GND, in synchronization with the primary-side signals LVON and LVOFF.

The secondary-side signal transmission circuit 114 receives the second voltage level signals (HVON, HVOFF) and generates the drive signal HO. Specifically, assuming that the second reference potential VS is set as a reference potential and a second power supply voltage VB is set as a power supply voltage, the secondary-side signal transmission circuit 114 generates the drive signal HO in synchro-nization with the signals HVON and HVOFF. The drive signal HO rises in synchronization with a rising edge of the signal HVON, and falls in synchronization with a rising edge of the signal HVOFF.

The level shift unit 110 can be configured using a publicly-known technique, and detailed descriptions thereof are omitted herein. The configuration of each circuit in the level shift unit 110 can be modified in various ways, and the signals LYON and LVOFF and signals HVON and HVOFF may be used as pulse signals and the level shift main circuit 113 may be driven by the pulse signals.

The desaturation voltage detection circuit 121 sets the detection signal Vdesat to HIGH when a voltage difference input through the terminals VU and VL is greater than a predetermined voltage difference. A terminal VU is connected to a collector electrode of the high-potential-side semiconductor switching device 102, and a terminal VL is connected to an emitter electrode thereof.

The desaturation voltage detection circuit 121 includes a high-voltage resistor unit 122 and a voltage difference determination unit 123. According to an embodiment, a collector-emitter voltage of the high-potential-side semiconductor switching device 102 is detected as a current difference, and it is determined whether the collector-emitter voltage is a saturation voltage or not based on the magnitude of a detected current Idiff, thereby making it possible to detect the desaturation state of the high-potential-side semiconductor switching device 102 due to an overcurrent caused by short-circuiting.

The high-voltage resistor unit 122 converts voltage values (collector voltage, emitter voltage), which are input through the terminals VU and VL, into current values. The high-voltage resistor unit 122 converts the voltage value (collector voltage), which is input through the terminal VU, into a current value IU, and converts the voltage value (emitter voltage), which is input through the terminal VL, into a current value IL.

The voltage difference determination unit 123 is a circuit that generates the detection signal Vdesat based on the difference between a first current IU and a second current IL. For example, when the current difference between the first current IU and the second current IL is greater than a predetermined current value (desaturation determination value), the detection signal Vdesat is set to HIGH. Thus, when the voltage difference (collector-emitter voltage) input through the terminals VU and VL is greater than a predetermined voltage value, an operation for setting the detection signal Vdesat to HIGH is implemented.

The noise filter circuit 124 filters the detection signal Vdesat in such a manner that the detection signal Vdesat is allowed to pass during an ON period (e.g., HIGH period) of the input signal HIN and the detection signal Vdesat is blocked during an OFF period (e.g., LOW period) of the input signal HIN. Specifically, the noise filter circuit 124 transmits the detection signal Vdesat to the narrow-width filter circuit 125 as the detection signal Vsh only when the input signal HIN is HIGH. Advantageous effects of the noise filter circuit 124 are described below. First, since the drive signal HO needs to be set to LOW when the input signal HIN is LOW, the high-potential-side semiconductor switching device 102 needs to be in an OFF state. In the OFF state, the collector-emitter potential difference may be greatly increased. In this case, the detection signal Vdesat becomes HIGH even when the desaturation voltage due to an over-current is not generated, so that erroneous detection may occur. The noise filter circuit 124 is inserted to prevent erroneous detection when the input signal HIN is LOW. The noise filter circuit 124 sets the detection signal Vsh to HIGH when the input signal HIN is HIGH and the detection signal Vdesat is HIGH. In the other cases, the detection signal Vsh is set to LOW.

The narrow-width filter circuit 125 blocks the transmission of the detection signal Vsh when the detection signal Vsh is a signal having a predetermined signal width or less. For example, as disclosed in WO 2014/115272, it takes some time from a time when the input signal HIN rises to a time when the high-potential-side semiconductor switching device 102 is brought into the saturation state. Accordingly, this circuit is inserted to prevent erroneous detection in that case. Although not illustrated, the signal Vsh which has passed through the narrow-width filter circuit 125 is preferably held at HIGH during a predetermined period after the signal rises, or until a predetermined signal is input. The predetermined signal may be generated within the circuit, or may be input from the outside of the circuit.

The primary-side signal transmission circuit 111, the voltage difference determination unit 123, the noise filter circuit 124, and the narrow-width filter circuit 125 are included in the primary-side circuit 112.

Figure 2:
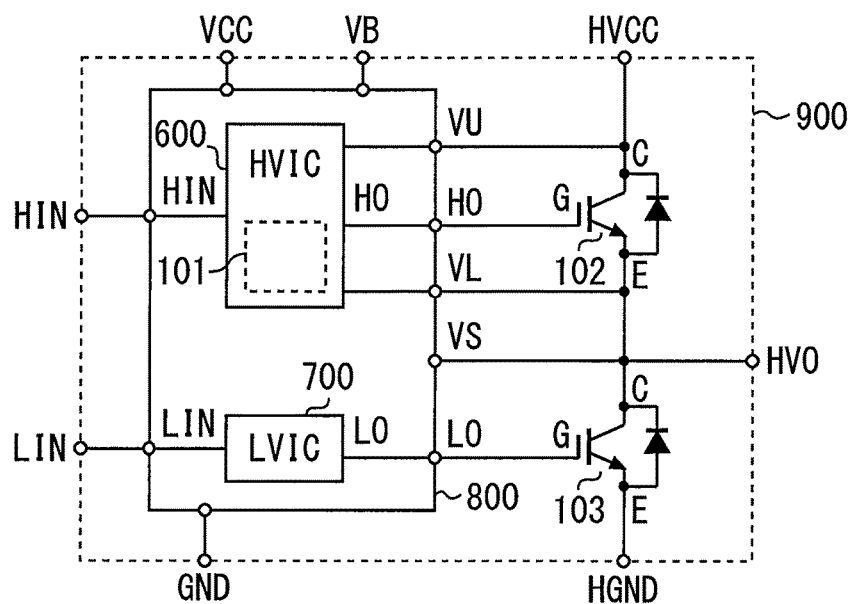
FIG. 2 is a circuit diagram illustrating an inverter device according to the first embodiment of the present invention.

FIG. 2 is a circuit diagram illustrating an inverter device 900 according to the first embodiment of the present invention. The inverter device 900 includes semiconductor switching devices 102 and 103, which are connected in series, and a drive module 800 that drives the semiconductor switching devices 102 and 103. The embodiment illustrates the semiconductor switching devices 102 and 103 as an example of an insulating gate bipolar transistor (IGBT). However, other transistors, such as a MOS field-effect transistor (MOSFET), may be used, and Si or SiC may be used as a material for the transistor.

The semiconductor switching device 102 is a high-potential-side semiconductor switching device (high-side switching device), and the semiconductor switching device 103 is a low-potential-side semiconductor switching device (low-side switching device). The collector electrode of the high-potential-side semiconductor switching device 102 is connected to a third power supply voltage HVCC, and the emitter electrode of the low-potential-side semiconductor switching device 103 is connected to a third reference potential HGND. The collector electrode of the low-potential-side semiconductor switching device 103 is connected to the emitter electrode of the high-potential-side semiconductor switching device 102.

The drive module 800 includes an HVIC 600 that drives the high-potential-side semiconductor switching device 102, and an LVIC 700 that drives the low-potential-side semiconductor switching device 103. The HVIC 600 has the integrated circuit 101 incorporated therein. The terminal VU is connected to the collector electrode of the high-potential-side semiconductor switching device 102, and the terminal VL is connected to the emitter electrode of the high-potential-side semiconductor switching device 102. According to the embodiment, the terminals VU and VL of the drive module 800 are respectively connected to the collector (drain of a MOSFET) electrode of the high-potential-side semiconductor switching device 102 and the emitter (source of a MOSFET) electrode thereof, thereby making it possible to detect the collector-emitter voltage of the high-potential-side semiconductor switching device 102.

The desaturation state of the high-potential-side semiconductor switching device 102 can be detected by the collector-emitter voltage of the high-potential-side semiconductor switching device 102. Specifically, in general, when the semiconductor switching devices 102 and 103 operate in a normally ON state, the collector-emitter voltage is held in a state where the semiconductor switching devices 102 and 103 are decreased to the saturation voltage. However, when the semiconductor switching devices 102 and 103 are brought into a short-circuit state, the collector-emitter voltage rises from the saturation voltage due to an overcurrent, and is brought into the desaturation state. Accordingly, the terminals VU and VL of the drive module 800 are connected to the collector electrode and the emitter electrode of the high-potential-side semiconductor switching device 102, and the voltage difference determination unit 123 determines whether the collector-emitter voltage is a saturation voltage or not, thereby making it possible to detect the desaturation voltage of the high-potential-side semiconductor switching device 102. For example, when the collector-emitter voltage is equivalent to the saturation voltage, the detection signal Vdesat is set to LOW, and when the collector-emitter voltage is equal to or higher than the saturation voltage, the detection signal Vdesat is set to HIGH.

Any method may be employed to process the detection signal Vsh which has detected the desaturation voltage. However, in FIG. 1, the primary-side signal transmission circuit 111 is a circuit in which the signal LVOFF rises when the detection signal Vsh is HIGH, and the high-potential-side semiconductor switching device 102 is turned off during desaturation voltage detection. As another mode, the integrated circuit 101 may be provided with an error signal terminal FO and the detection signal Vsh may be output to the outside of the drive module 800 as an error signal (FO signal).

Figure 15:
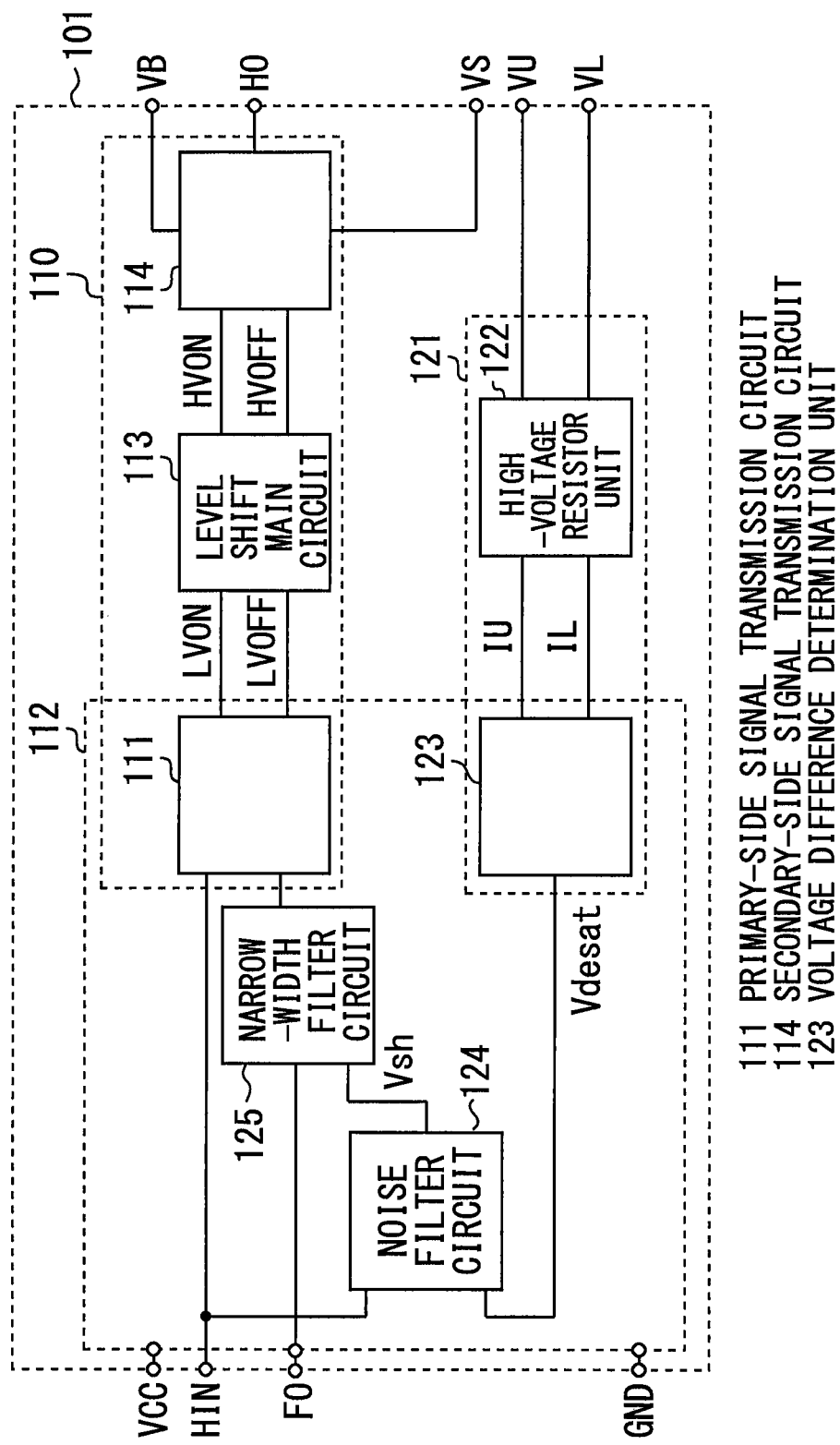
FIG. 15 illustrates a circuit diagram of a modified example of the first embodiment of the present invention.

FIG. 15 illustrates a modified example of the first embodiment in which the integrated circuit 101 is provided with the error signal terminal FO. The error signal terminal FO is exposed to the outside of the integrated circuit 101, and the error signal (FO signal) is output through the error signal terminal FO in response to the detection signal Vdesat.

Note that, in general, the second reference potential VS terminal is connected to the emitter electrode of the high-potential-side semiconductor switching device 102. Accordingly, the terminal VL and the terminal VS may be integrated into one terminal.

Figure 3:
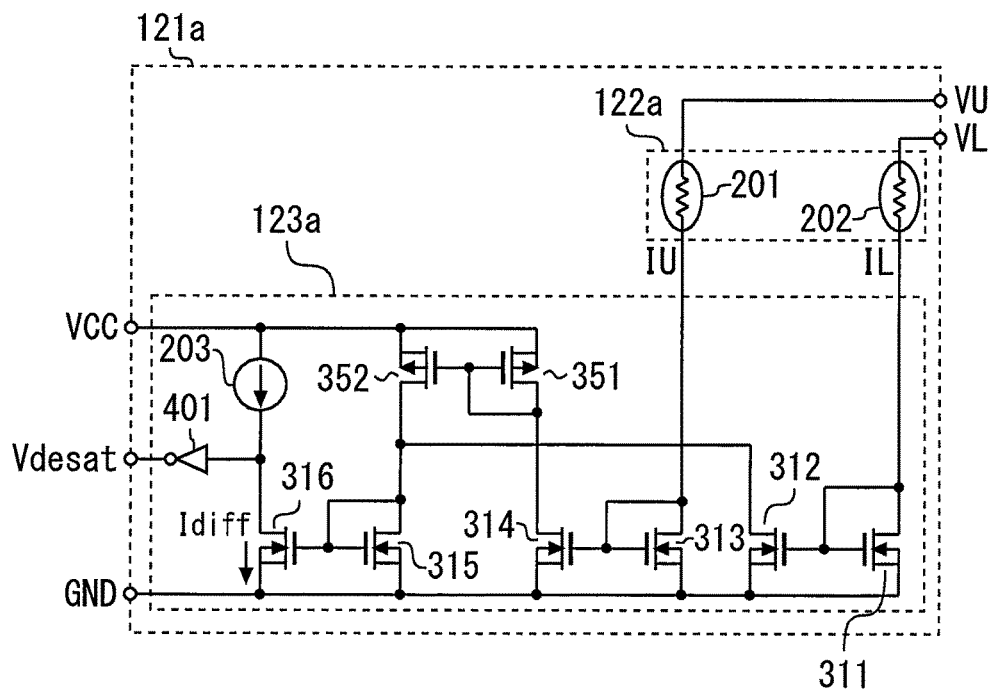
FIG. 3 is a circuit diagram illustrating an example of a desaturation voltage detection circuit of the integrated circuit according to the first embodiment of the present invention.

FIG. 3 is a circuit diagram illustrating an example of a desaturation voltage detection circuit 121a of the integrated circuit 101 according to the first embodiment of the present invention. The desaturation voltage detection circuit 121a includes a high-voltage resistor unit 122a and a voltage difference determination unit 123a. The high-voltage resistor unit 122a includes a first high-voltage resistor 201 and a second high-voltage resistor 202. The first high-voltage resistor 201 generates the first current IU from a voltage applied to the collector electrode of the high-potential-side semiconductor switching device 102 through the terminal VU. The second high-voltage resistor 202 generates the second current IL from a voltage applied to the emitter electrode of the high-potential-side semiconductor switching device 102 through the terminal VL. As described above, the voltage difference determination unit 123a sets the detection signal Vdesat to HIGH when the difference between the first current IU and the second current IL is equal to or greater than a predetermined current value (desaturation determination value). Thus, the desaturation voltage due to an overcurrent is detected.

The embodiment illustrates an example in which the detection signal Vdesat is set to HIGH when the voltage difference between the terminals VU and VL is greater than the predetermined voltage value. In a case similar to the embodiment, the detection signal Vdesat may be set to LOW. In this case, the detection signal Vdesat is set to HIGH (i.e., normally HIGH) in a normal state in which an overcurrent is not detected.

The first and second high-voltage resistors 201 and 202 convert the voltages input through the terminals VU and VL into the currents IU and IL, respectively. The current IL is input to a "first current mirror circuit" which is composed of NMOSFETs 311 and 312, and the current IU is input to a "second current mirror circuit" which is composed of NMOSFETs 313 and 314. A current output from the second current mirror circuit is further input to a "third current mirror circuit" which is composed of PMOSFETs 351 and 352. A difference between a current output from the first current mirror circuit and a current output from the third current mirror circuit is input to a "fourth current mirror circuit" which is composed of NMOSFETs 315 and 316, and a current output from the fourth current mirror circuit is the current Idiff corresponding to the difference between the currents IU and IL.

A voltage at a node between a constant current circuit 203 and the NMOSFET 316 is input to an inverter (NOT circuit) 401, and it is determined whether the current Idiff is a predetermined current value (desaturation determination value) or larger. In the case of FIG. 3, the detection signal Vdesat is set to HIGH when the current Idiff is equal to or larger than the desaturation determination value, and the detection signal Vdesat is set to LOW when the current Idiff is smaller than the desaturation determination value. The current Idiff illustrated in FIG. 3 is equivalent to the voltage difference between the terminal VU and the terminal VL. Accordingly, such an operation is equivalent to a state where the detection signal Vdesat becomes HIGH when the voltage difference is large, and the detection signal Vdesat becomes LOW when the voltage difference is small.

The current value of the constant current circuit 203 is preliminarily set to a current value at which it can be determined whether the voltage difference between the terminal VU and the terminal VL is the saturation voltage of the high-potential-side semiconductor switching device 102 or not. Accordingly, the detection signal Vdesat can be set to HIGH when the voltage difference between the terminals VU and VL is equal to or greater than the saturation voltage, and the detection signal Vdesat can be set to LOW when the voltage difference between the terminals VU and VL is smaller than the saturation voltage.

The integrated circuit 101 has a configuration in which the level shift unit 110, the first high-voltage resistor 201, second high-voltage resistor 202, and the voltage difference determination unit 123a are provided in a single integrated circuit chip. The first high-voltage resistor 201 and the second high-voltage resistor 202 are preferably formed as a resistor pattern on a substrate in the integrated circuit 101. With this configuration, the high-voltage resistor for desaturation voltage detection can be provided in a remarkably small space, unlike in a case where a high-voltage lead resistor is provided outside of the circuit. The first and second high-voltage resistors 201 and 202 are also provided in the integrated circuit 101. This configuration enables detection of the desaturation voltage by one integrated circuit 101 and eliminates the need for mounting other resistor components for desaturation voltage detection. Consequently, constraints in terms of design and production of the HVIC 600, the drive module 800, and the inverter device 900 can be reduced, which leads to miniaturization of the drive module 800 and the inverter device 900.

Second Embodiment

Figure 4:
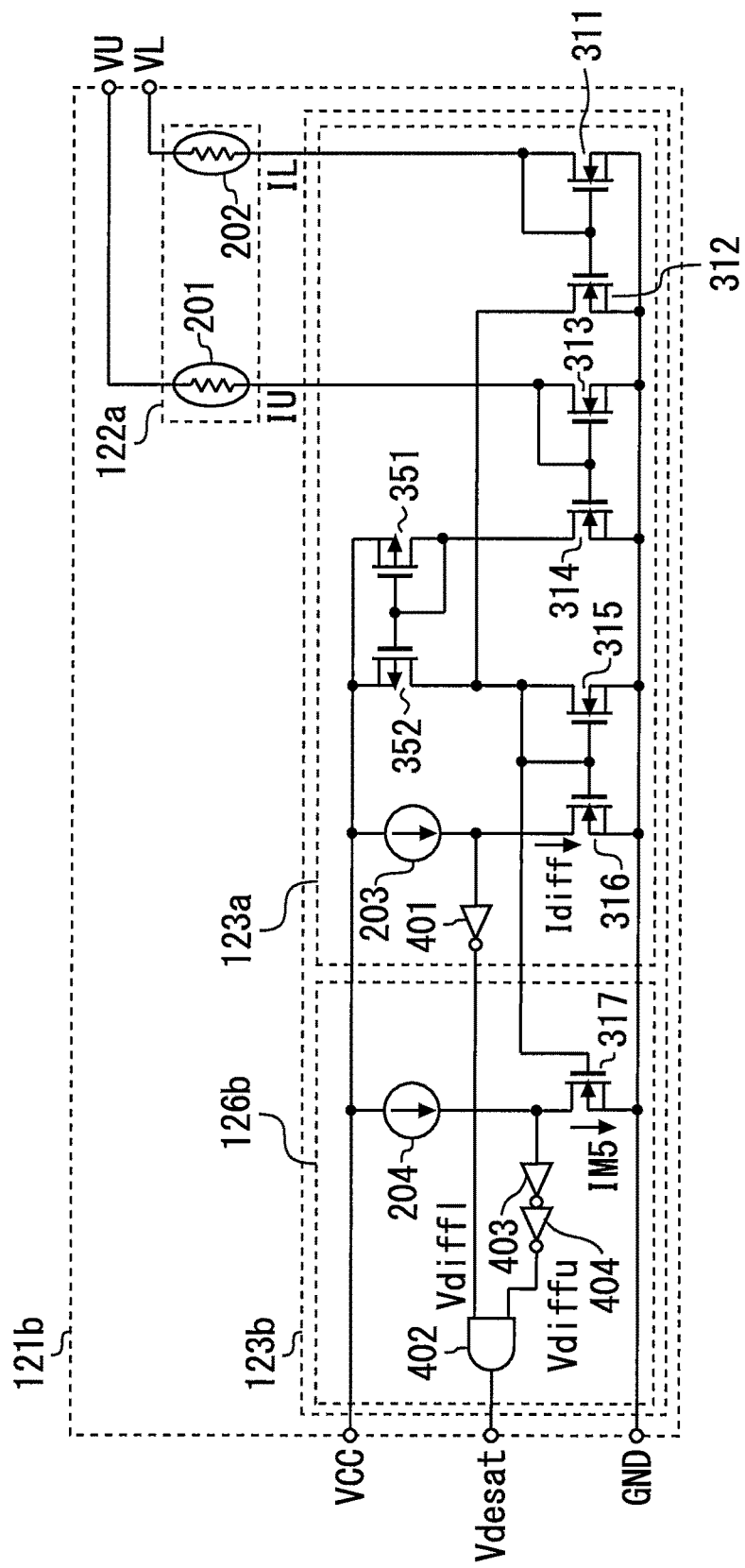
FIG. 4 is a circuit diagram illustrating a desaturation voltage detection circuit of an integrated circuit according to a second embodiment of the present invention.

FIG. 4 is a circuit diagram illustrating a desaturation voltage detection circuit 121b of an integrated circuit according to a second embodiment of the present invention. The integrated circuit according to the second embodiment has a configuration similar to that of the integrated circuit 101 according to the first embodiment, except that the desaturation voltage detection circuit 121a is replaced by the desaturation voltage detection circuit 121b. A determination limiting unit 126b includes a current comparison unit composed of a constant current circuit 204 and an NMOSFET 317, and a logic circuit composed of inverters 403 and 404 and an AND circuit 402. The NMOSFET 317 and the NMOSFET 315 constitute a "fifth current mirror circuit". The fifth current mirror circuit outputs a current IM5, which is a current difference between the current IU and the current IL, in a manner similar to the fourth current mirror circuit composed of the NMOSFETs 315 and 316. A voltage at a node between the constant current circuit 204 and the drain of the NMOSFET 317 is input to the inverter 403. An output of the inverter 403 is input to the inverter 404. A signal Vdiffu, which is an output of the inverter 404, is input to the AND circuit 402. The AND circuit 402 receives a detection signal Vdiffl output from the voltage difference determination unit 123a.

Even when the high-potential-side semiconductor switching device 102 is in the OFF state, the collector-emitter voltage of the high-potential-side semiconductor switching device 102 may be equal to or higher than the saturation voltage. In this case, erroneous detection of the desaturation state needs to be prevented. Accordingly, in the second embodiment, erroneous detection of the desaturation state is prevented by determining the OFF state of the high-potential-side semiconductor switching device 102. To achieve this, when the voltage difference (i.e., the current difference Idiff between the first current IU and the second current IL) of the voltage difference determination unit 123 is extremely large, it is determined that the desaturation state due to an overcurrent is not generated. Specifically, an upper limit is set to the value of the current difference Idiff output from the detection signal Vdesat.

According to the circuit configuration illustrated in FIG. 4, the constant current from the constant current circuit 204 is compared with the current IM5. When the current IM5 is equal to or less than the current value of the constant current circuit 204, the signal Vdiffu is set to HIGH. On the contrary, when the current IM5 exceeds the current value of the constant current circuit 204, the signal Vdiffu is set to LOW. Specifically, assuming that the current value of the constant current circuit 204 is set as an "upper limit value", and the signal Vdiffu is set to HIGH only when the current IM5 is equal to or less than the upper limit value.

When the high-potential-side semiconductor switching device 102 is in the OFF state and the collector-emitter voltage is equal to or higher than the saturation voltage, the voltage difference between the terminal VU and the terminal VL is supposed to indicate a value equal to or greater than a certain specific voltage. In the second embodiment, this specific voltage is checked, an "OFF determination voltage" is preliminarily set. The OFF determination voltage of the high-potential-side semiconductor switching device 102 corresponds to a voltage obtained by subtracting the saturation voltage of the low-potential-side semiconductor switching device 103 from the third power supply voltage HVCC. The current value of the constant current circuit 204 is preliminarily set to a current value for determining whether the voltage difference between the terminal VU and the terminal VL is the OFF determination voltage or not.

The AND circuit 402 receives the signal Vdiffu and the detection signal Vdiffl from the voltage difference determination unit 123a. Only when both the detection signal Vdiffl and the signal Vdiffu are HIGH, the AND circuit 402 becomes HIGH and the detection signal Vdesat becomes HIGH. Thus, the detection signal Vdesat can be set to HIGH only when the collector-emitter voltage is the desaturation voltage higher the saturation voltage (i.e., the collector-emitter voltage is higher than the saturation voltage=ON corresponding voltage value during normal operation) and the collector-emitter voltage is equal to or lower than the OFF determination voltage.

As described above, the determination limiting unit 126b causes the signal Vdiffl of HIGH level of the voltage difference determination unit 123a to pass when the current difference Idiff is equal to or smaller than the upper limit value, and sets the detection signal Vdesat to HIGH. On the other hand, the determination limiting unit 126b blocks the signal Vdiffl from the voltage difference determination unit 123a when the current difference Idiff is greater than the upper limit value, and holds the detection signal Vdesat at LOW. Thus, the determination limiting unit 126b can selectively transmit the detection signal Vdesat. Specifically, only when the collector-emitter voltage of the high-potential-side semiconductor switching device 102 is within a specific range, the determination limiting unit 126b can set the detection signal Vdesat to HIGH. The phrase "within a specific range" refers to the inside of a range from the saturation voltage to the OFF determination voltage. As a result, when the high-potential-side semiconductor switching device 102 is in the OFF state, erroneous detection of the desaturation state due to an overcurrent can be prevented.

Third Embodiment

Figure 5:
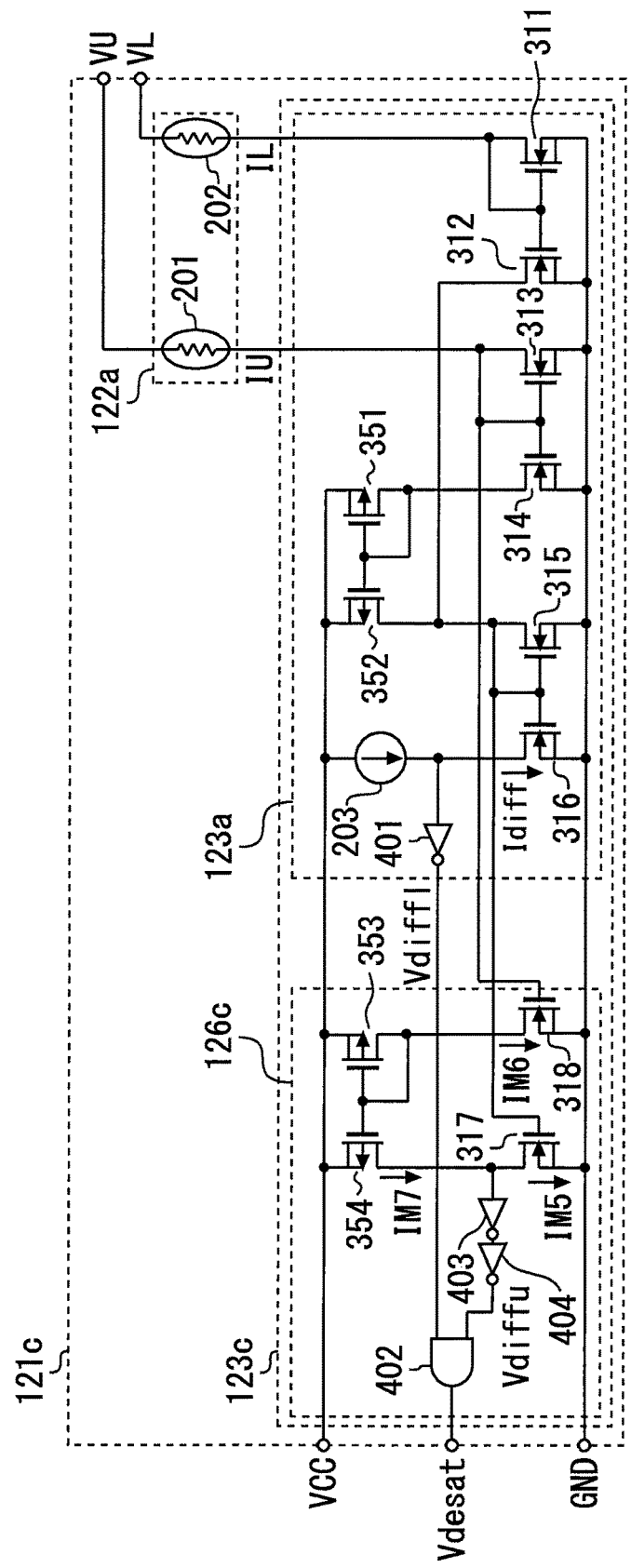
FIG. 5 is a circuit diagram illustrating a desaturation voltage detection circuit of an integrated circuit according to a third embodiment of the present invention.

FIG. 5 is a circuit diagram illustrating a desaturation voltage detection circuit 121c of an integrated circuit according to a third embodiment of the present invention. The integrated circuit according to the third embodiment has a configuration similar to that of the integrated circuit according to the second embodiment, except that the desaturation voltage detection circuit 121b is replaced by the desaturation voltage detection circuit 121c. The desaturation voltage detection circuit 121c according to the third embodiment includes a voltage difference determination unit 123c, and the voltage difference determination unit 123c has a configuration in which a determination limiting unit 126c is added to the voltage difference determination unit 123a. The determination limiting unit 126c differs from the determination limiting unit 126b in that the determination limiting unit 126c includes an NMOSFET 318 and PMOSFETs 353 and 354 in place of the constant current circuit 204 illustrated in FIG. 4. The NMOSFET 318 and the NMOSFET 313 constitute a "sixth current mirror circuit", and the sixth current mirror circuit outputs a current corresponding to the current IU. The PMOSFETs 353 and 354 constitute a "seventh current mirror circuit". A current IM6 output from the sixth current mirror circuit is input to the seventh current mirror circuit.

In this case, a current IM7 output from the seventh current mirror circuit serves as the "upper limit value" similar to that of the output current from the constant current circuit 204, and is adjusted to "the value corresponding to the OFF determination voltage" described in the second embodiment. The output current IM7 of the seventh current mirror circuit is compared with the output current IM5 of the fifth current mirror circuit composed of the NMOSFETs 317 and 315, thereby implementing a circuit operation similar to that of the second embodiment.

Furthermore, the output current IM7 of the seventh current mirror circuit varies depending on the voltage input to the terminal VU, i.e., the third power supply voltage HVCC. Specifically, the current IU increases as the voltage of the terminal VU increases, and the current flowing through the NMOSFET 313 increases, so that the output current IM6 from the sixth current mirror circuit increases. As a result, the output current (i.e., source-drain current of the MOSFET 318) of the seventh current mirror circuit is adjusted to a larger value as the third power supply voltage HVCC increases.

According to the third embodiment, the upper limit value of the voltage difference (current Idiff) associated with the determination of the desaturation voltage described in the second embodiment can be adjusted depending on the third power supply voltage HVCC. In the second embodiment, the upper limit value is determined uniquely to the current value of the constant current circuit 204. When the third power supply voltage HVCC is different to the original design condition, there is a need to change the design of the constant current circuit 204. In this regard, according to the third embodiment, the upper limit value is automatically adjusted depending on the third power supply voltage HVCC, which eliminates the need for changing the design of the constant current circuit.

Fourth Embodiment

Figure 6:
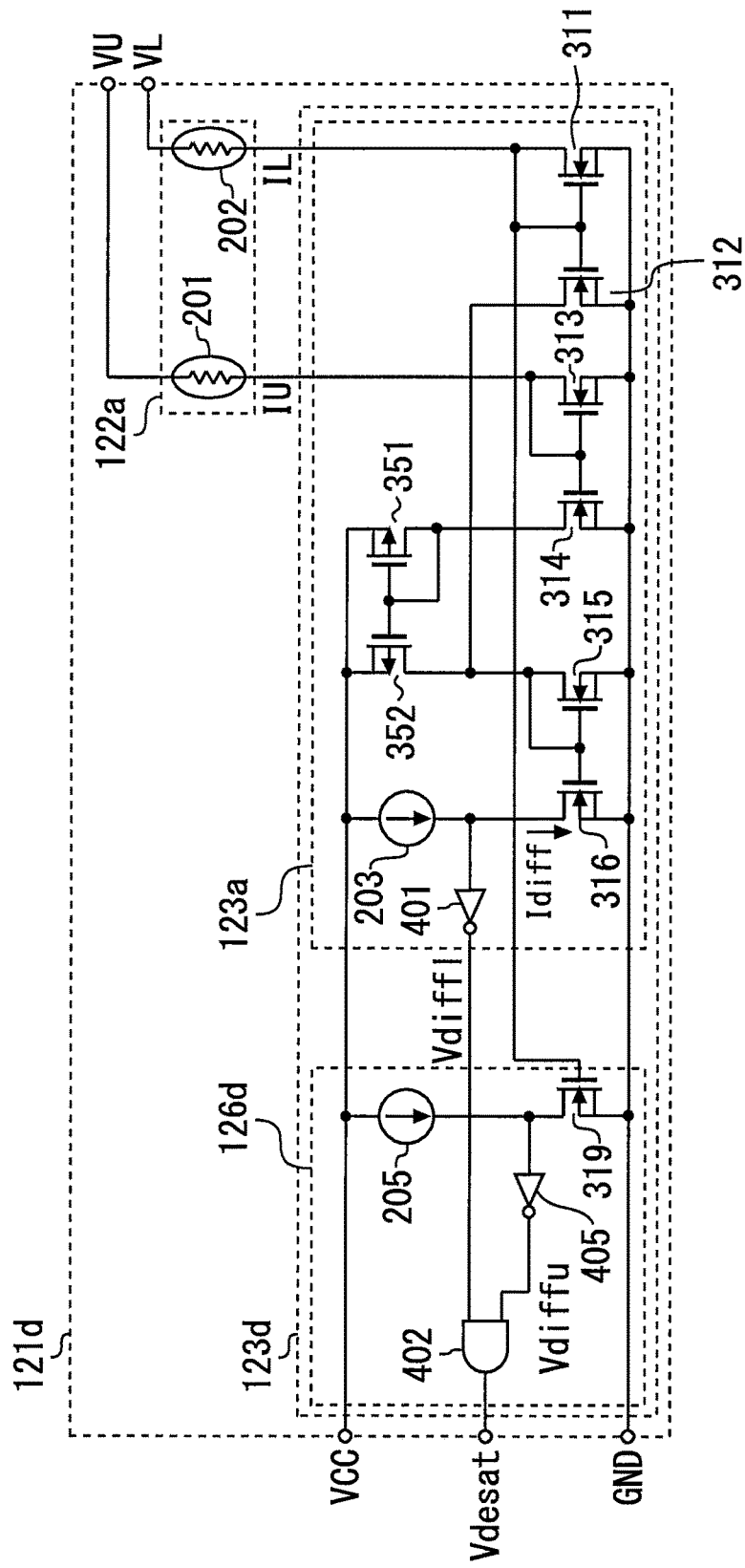
FIG. 6 is a circuit diagram illustrating a desaturation voltage detection circuit of an integrated circuit according to a fourth embodiment of the present invention.

FIG. 6 is a circuit diagram illustrating a desaturation voltage detection circuit 121d of an integrated circuit according to a fourth embodiment of the present invention. The integrated circuit according to the fourth embodiment has a configuration similar to that of the integrated circuit according to the second embodiment, except that the desaturation voltage detection circuit 121b is replaced by the desaturation voltage detection circuit 121d. The desaturation voltage detection circuit 121d according to the fourth embodiment has a circuit configuration similar to that of the second and third embodiments, except that the desaturation voltage detection circuit 121d includes a determination limiting unit 126d in place of the determination limiting units 126b and 126c.

In general, when the high-potential-side semiconductor switching device 102 is in the OFF state and the collector-emitter voltage is equal to or higher than the saturation voltage, the emitter voltage acquired through the terminal VL is a voltage equal to or less than a certain specific value. This specific value is hereinafter also referred to as an "OFF-time emitter voltage value". The "OFF-time emitter voltage value" is a voltage that is higher than a third reference potential HGND by an amount equal to the saturation voltage of the low-potential-side semiconductor switching device 103. On the other hand, during a short-circuit operation of the high-potential-side semiconductor switching device 102, the emitter voltage is higher than the OFF-time emitter voltage value described above. Accordingly, erroneous detection of the desaturation voltage during the off operation can be prevented by determining whether the emitter voltage corresponds to the OFF-time emitter voltage value or not. In the fourth embodiment, the above-described features are utilized, a function for preventing erroneous detection during the off operation based on the emitter voltage of the high-potential-side semiconductor switching device 102 that is input from the terminal VL is added to the circuit configuration according to the first embodiment.

The determination limiting unit 126d includes a constant current circuit 205, an NMOSFET 319, an inverter 405, and an AND circuit 402. The NMOSFET 319 and the NMOSFET 311 constitute an "eighth current mirror circuit". The eighth current mirror circuit generates an output current obtained by duplicating the second current IL. The current value of the constant current circuit 205 is set to a value corresponding to the second current IL when the emitter voltage is the "OFF-time emitter voltage value". A node between the constant current circuit 205 and the drain of the NMOSFET 319 is connected to the input side of the inverter 405. The output of the inverter 405 becomes the signal Vdiffu. The detection signal Vdiffl output from the voltage difference determination unit 123a and the signal Vdiffu described above are input to the AND circuit 402.

When the emitter voltage acquired by the terminal VL is higher than the OFF-time emitter voltage value, the second current IL is larger than the current value of the constant current circuit 205. When the second current IL is larger than the current value of the constant current circuit 205, the input of the inverter 405 becomes LOW and the signal Vdiffu becomes HIGH. When the signal Vdiffu is HIGH, the output signal from the AND circuit 402, i.e., the detection signal Vdesat, becomes HIGH in response to the HIGH level of the detection signal Vdiffl. On the contrary, when the emitter voltage acquired by the terminal VL is equal to or less than the OFF-time emitter voltage value, the signal Vdiffu becomes LOW and the detection signal Vdesat is maintained at LOW.

In this manner, the determination limiting unit 126d causes the detection signal Vdiffl to pass when the emitter voltage acquired by the terminal VL is higher than the OFF-time emitter voltage value, and sets the detection signal Vdesat to HIGH in response to the HIGH level of the detection signal Vdiffl. On the other hand, when the emitter voltage acquired by the terminal VL is equal to or lower than the OFF-time emitter voltage value, the determination limiting unit 126d maintains the detection signal Vdesat at LOW by blocking the detection signal Vdiffl. In this manner, the determination limiting unit 126d can selectively transmit the detection signal Vdiffl according to the magnitude of the emitter voltage acquired by the terminal VL.

According to the fourth embodiment, erroneous detection can be prevented without depending on the third power supply voltage HVCC. Further, when the desaturation voltage detection circuit 121d according to the fourth embodiment is mounted, the value of the current flowing in the circuit can be suppressed to a small value, and thus a current consumption in the integrated circuit 101 and the drive module 800 incorporating the integrated circuit 101 can also be reduced.

Fifth Embodiment

Figure 7:
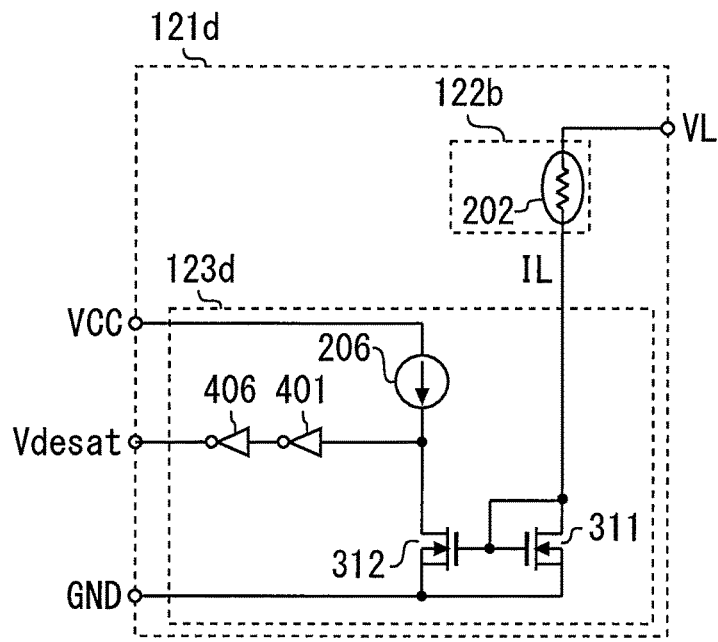
FIG. 7 is a circuit diagram illustrating a desaturation voltage detection circuit of an integrated circuit according to a fifth embodiment of the present invention.

FIG. 7 is a circuit diagram illustrating a desaturation voltage detection circuit 121d of an integrated circuit according to a fifth embodiment of the present invention. The integrated circuit according to the fifth embodiment has a configuration similar to that of the integrated circuit 101 according to the first embodiment, except that the desaturation voltage detection circuit 121a is replaced by a desaturation voltage detection circuit 121d and the terminal VU is omitted. An integrated circuit and an inverter device according to the fifth embodiment can be provided by modifying the integrated circuit 101 illustrated in FIG. 1 and the inverter device 900 illustrated in FIG. 2 in such a manner that the desaturation voltage detection circuit 121 in the integrated circuit 101 is replaced by the desaturation voltage detection circuit 121d illustrated in FIG. 7.

The third power supply voltage HVCC is applied to the collector electrode of the high-potential-side semiconductor switching device 102. When the high-potential-side semiconductor switching device 102 operates in the normally ON state and the collector-emitter voltage is the saturation voltage, the emitter voltage becomes a voltage (hereinafter also referred to as an "ON-time emitter voltage value") which is lower than the collector voltage by an amount equal to the saturation voltage of the high-potential-side semiconductor switching device 102. At the time of generating a desaturation voltage due to a short-circuit operation, a voltage drop from the collector voltage increases as the collector-emitter voltage increases. As a result, the emitter voltage decreases, unlike in a case where a saturation voltage is generated. Accordingly, the desaturation voltage of the high-potential-side semiconductor switching device 102 can also be detected only by monitoring the emitter voltage by utilizing the fact that the emitter voltage decreases during a short-circuit operation. Therefore, in the fifth embodiment, as illustrated in FIG. 7, the terminal VU and the first high-voltage resistor 201 are omitted.

The desaturation voltage detection circuit 121d includes a high-voltage resistor unit 122b composed only of the second high-voltage resistor 202, and a voltage difference determination unit 123d. The voltage difference determination unit 123d includes the first current mirror circuit composed of the NMOSFETs 311 and 312, a constant current circuit 206 connected to the drain of the MOSFET 312, the inverter 401 that receives a voltage at a node between the drain of the MOSFET 312 and the constant current circuit 206, and an inverter 406 that receives the output signal from the inverter 401. The output of the inverter 406 becomes the detection signal Vdesat.

The current value of the constant current circuit 206 is preliminarily set to a current value corresponding to the second current IL obtained when the "ON-time emitter voltage value" is applied to the terminal VL. The current value of the constant current circuit 206 is compared with the second current IL, thereby making it possible to detect whether the emitter voltage applied to the terminal VL is the "ON-time emitter voltage value" or not, i.e., whether the collector-emitter voltage is the saturation voltage or not. When the desaturation voltage is not generated, the emitter voltage is supposed to indicate the ON-time emitter voltage value, and the current value IL indicates a value that is equal to or greater than the current value of the constant current circuit 206, so that the detection signal Vdesat becomes LOW. On the other hand, when the emitter voltage decreases due to the desaturation voltage being generated, the current value IL is less than the current value of the constant current circuit 206 and thus the detection signal Vdesat becomes HIGH. Thus, the desaturation voltage can be detected.

According to the fifth embodiment, the use of a single high-voltage resistor makes it possible to solve the problem with pairing when a plurality of high-voltage resistor patterns is provided on a substrate in an integrated circuit. Specifically, in the first to fourth embodiments, when the characteristics (resistor values) between the first high-voltage resistor 201 and the second high-voltage resistor 202 vary, it is difficult to accurately compare the first current IU with the second current IL. Accordingly, when high-voltage resistor patterns are formed for each of the first high-voltage resistor 201 and the second high-voltage resistor 202, it is necessary to suppress characteristic variations and sufficiently match the characteristics (pairing). In this regard, according to the fifth embodiment, only the second high-voltage resistor 202 is required, which eliminates the need for pairing. Note that it is preferable to adjust the current value of the constant current circuit 206 by laser beam machining. Consequently, variations in the production of the second high-voltage resistor 202 can also be suppressed.

Note that in the fifth embodiment, the current of the constant current circuit 206 corresponds to the "predetermined current" in the second and fourth inventions described above, and the second current IL corresponds to the "detection current" in the second and fourth inventions described above.

Sixth Embodiment

Figure 8:
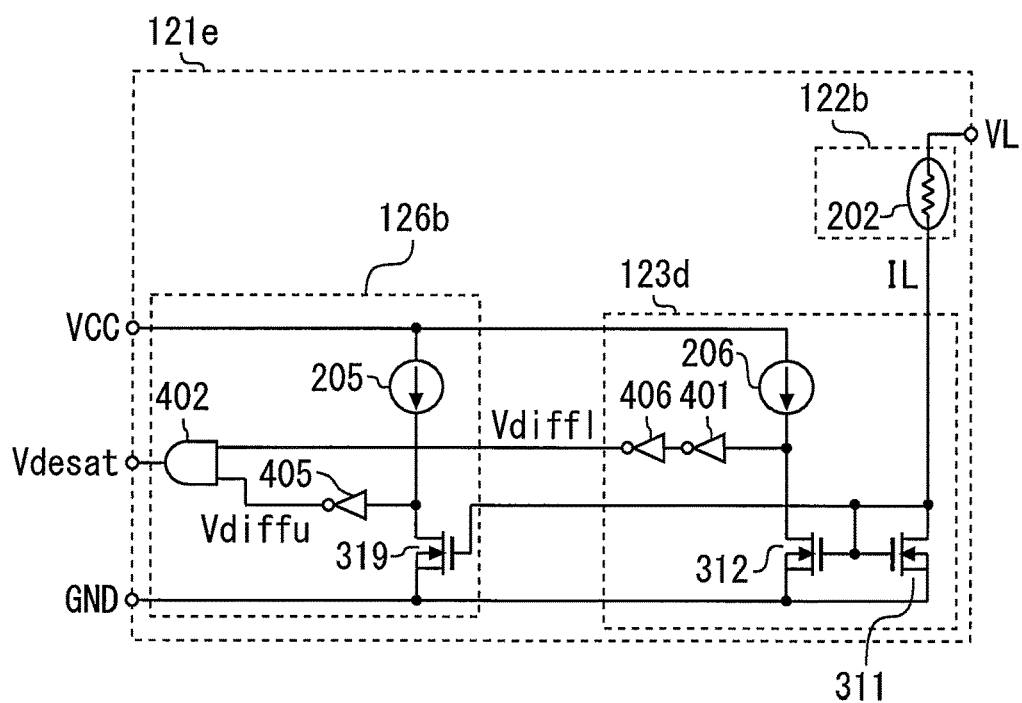
FIG. 8 is a circuit diagram illustrating a desaturation voltage detection circuit of an integrated circuit according to a sixth embodiment of the present invention.

FIG. 8 is a circuit diagram illustrating a desaturation voltage detection circuit 121e of the integrated circuit according to a sixth embodiment of the present invention. The desaturation voltage detection circuit 121e has a configuration in which the determination limiting unit 126d illustrated in FIG. 6 is added to the desaturation voltage detection circuit 121d illustrated in FIG. 7. In the same manner as described above with reference to FIG. 6, the determination limiting unit 126d can selectively transmit the detection signal Vdiffl by causing the detection signal Vdiffl of HIGH level output from the voltage difference determination unit 123d to pass when the voltage of the terminal VL is higher than the OFF-time emitter voltage value, to thereby set the detection signal Vdesat to HIGH, and by blocking the detection signal Vdiffl when the voltage of the terminal VL is equal to or lower than the OFF-time emitter voltage value, to thereby set the detection signal Vdesat to LOW. The determination limiting unit 126d determines whether the emitter voltage is the "OFF-time emitter voltage value" or not, thereby causing the detection signal Vdiffl output from the voltage difference determination unit 123d to pass when the emitter voltage is lower than the "ON-time emitter voltage value" and the emitter voltage is higher than the "OFF-time emitter voltage value", to thereby set the detection signal Vdesat to HIGH. Accordingly, like in the fourth embodiment (see FIG. 6), an advantageous effect of preventing erroneous detection by setting a lower limit value of the emitter voltage can be obtained.

Seventh Embodiment

Figure 9:
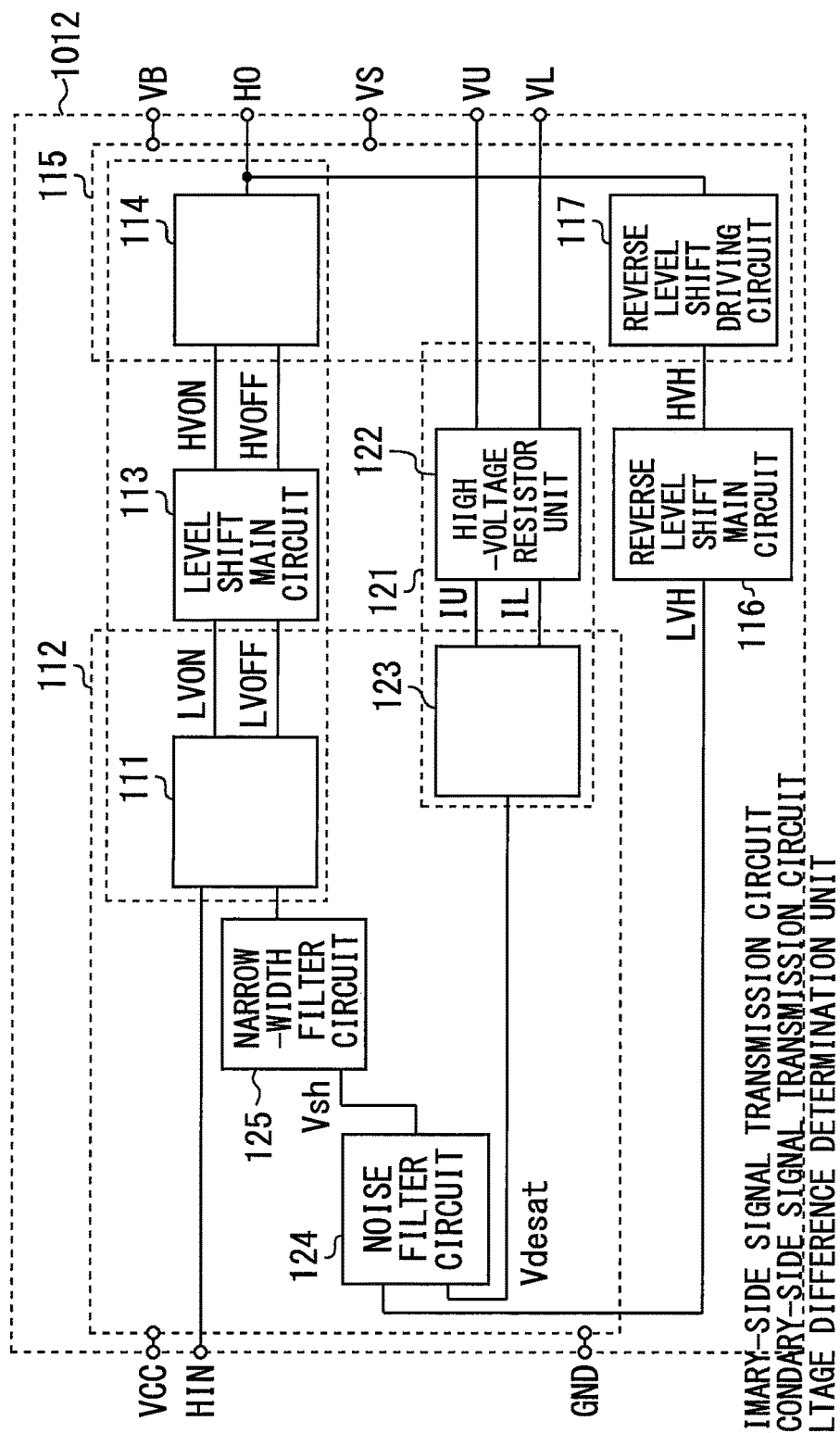
FIG. 9 is a circuit block diagram illustrating a semiconductor device driving integrated circuit according to a seventh embodiment of the present invention.

FIG. 9 is a circuit block diagram illustrating a semiconductor device driving integrated circuit 1012 (hereinafter also referred to simply as the integrated circuit 1012) according to a seventh embodiment of the present invention. The integrated circuit 1012 according to the seventh embodiment is a noise filter implemented using the drive signal HO by modifying the circuit configuration of the first embodiment. Specifically, in the first embodiment, erroneous detection due to the input signal HIN when the input signal HIN is LOW is prevented, while in the seventh embodiment, erroneous detection when the drive signal HO is LOW is prevented using the drive signal HO.

According to the seventh embodiment, even when the drive signal HO operates in a manner different from that of the input signal HIN, erroneous detection can be prevented. For example, due to a malfunction of the level shift main circuit 113, the drive signal HO may become HIGH even when the input signal HIN is LOW. At this time, since the high-potential-side semiconductor switching device 102 is in the ON state, the detection signal Vsh needs to be transmitted to a subsequent stage, but is not transmitted to the subsequent stage in the first embodiment. The use of the drive signal HO makes it possible to perform detection depending on the state of the semiconductor switching device also in the above-mentioned case.

The integrated circuit 1012 illustrated in FIG. 9 has a configuration in which a reverse level shift main circuit 116 and a reverse level shift drive circuit 117 are added to the integrated circuit 101 illustrated in FIG. 1 and an output signal LVH from the reverse level shift main circuit 116 is input to the noise filter circuit 124. The reverse level shift drive circuit 117 receives the drive signal HO, and generates a signal HVH that rises in synchronization with a rising edge of the drive signal HO. The reverse level shift main circuit 116 is a circuit that generates the signal LVH in synchronization with the signal HVH, and shifts the level of the signal HVH to the signal LVH. The level of the power supply voltage of the signal HVH is the second power supply voltage VB, and the level of the reference potential of the signal HVH is the second reference potential VS. The level of the power supply voltage of the signal LVH is the first power supply voltage VCC, and the level of the reference potential of the signal LVH is the first reference potential GND. The noise filter circuit 124 receives the detection signal Vdesat and the signal LVH. The noise filter circuit 124 filters the detection signal Vdesat in such a manner that the detection signal Vdesat is allowed to pass during the ON period (HIGH period) of the drive signal HO, and the detection signal Vdesat is blocked during the OFF period (LOW period) of the drive signal HO. Thus, when the signal LVH is HIGH and the detection signal Vdesat is HIGH, the detection signal Vsh can be set to HIGH. Note that the reverse level shift main circuit 116 and the like can be configured using publicly-known techniques, and thus detailed descriptions thereof are omitted.

Eighth Embodiment

Figure 10:
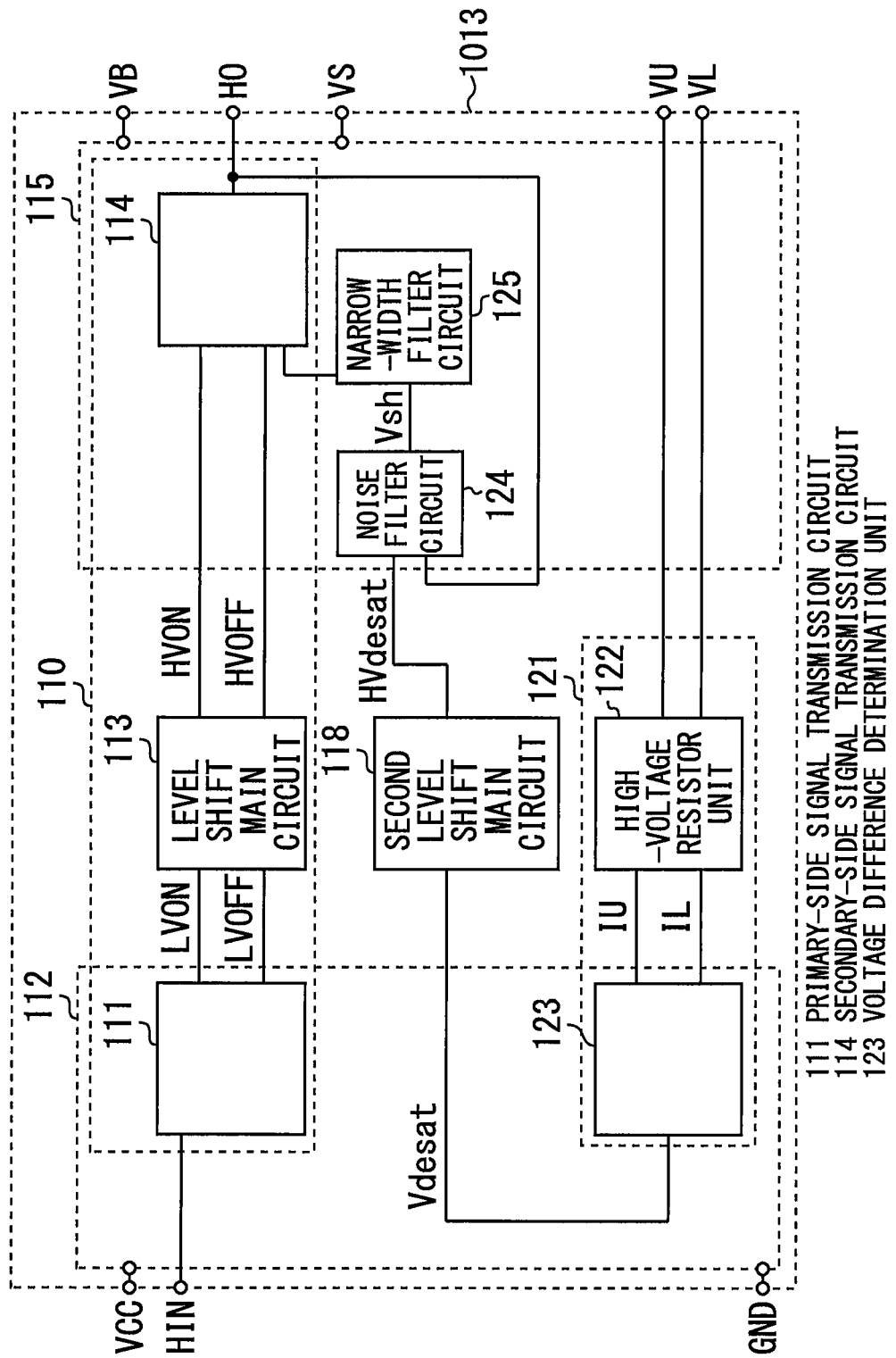
FIG. 10 is a circuit block diagram illustrating a semiconductor device driving integrated circuit according to a eighth embodiment of the present invention.

FIG. 10 is a circuit block diagram illustrating a semiconductor device driving integrated circuit 1013 (hereinafter also referred to simply as the integrated circuit 1013) according to an eighth embodiment of the present invention. In the integrated circuit 1013 according to the eighth embodiment, a noise filter using the drive signal HO is implemented on the secondary side by modifying the circuit configuration to the seventh embodiment. In the seventh embodiment, the drive signal HO is transmitted to the primary side, while in this embodiment, the detection signal Vdesat is transmitted to the secondary side. According to this embodiment, the operation of the level shift circuit can be simplified.

The integrated circuit 1013 includes a second level shift main circuit 118, and the noise filter circuit 124 and the narrow-width filter circuit 125 are provided not in the primary-side circuit 112, but instead are provided in a secondary-side circuit 115. Since the voltage difference determination unit 123 is provided in the primary-side circuit 112, the detection signal Vdesat is generated based on the first reference potential GND. The second level shift main circuit 118 generates a high-potential detection signal HVdesat by shifting the voltage level of the detection signal Vdesat. Specifically, the second level shift main circuit 118, the second level shift main circuit 118 generates the high-potential detection signal HVdesat, which is a signal based on the second reference potential VS, in synchronization with the detection signal Vdesat. The high-potential detection signal HVdesat is input to the noise filter circuit 124. The noise filter circuit 124 sets the detection signal Vsh to HIGH when the drive signal HO is HIGH and the high-potential detection signal HVdesat is HIGH.

When the detection signal Vsh which has passed through the noise filter circuit 124 and the narrow-width filter circuit 125 (so-called filtered detection signal) is HIGH, the secondary-side signal transmission circuit 114 sets the drive signal HO to LOW so as to turn off the high-potential-side semiconductor switching device 102. When the detection signal Vsh is HIGH and the detection signal Vsh falls, the input of the signals HVON and HVOFF is not accepted and the state of the drive signal HO is maintained. When the detection signal Vsh is LOW, the drive signal HO rises in synchronization with a rising edge of the signal HVON and the drive signal HO falls in synchronization with a rising edge of the signal HVOFF.

According to the eighth embodiment, the detection signal Vdesat can be transmitted to the secondary-side circuit 115 as the high-potential detection signal HVdesat. With this configuration, an advantageous effect of simplifying the operation of the primary-side signal transmission circuit 111, which results in simplifying the level shift operation of the input signal HIN can also be obtained.

Ninth Embodiment

Figure 11:
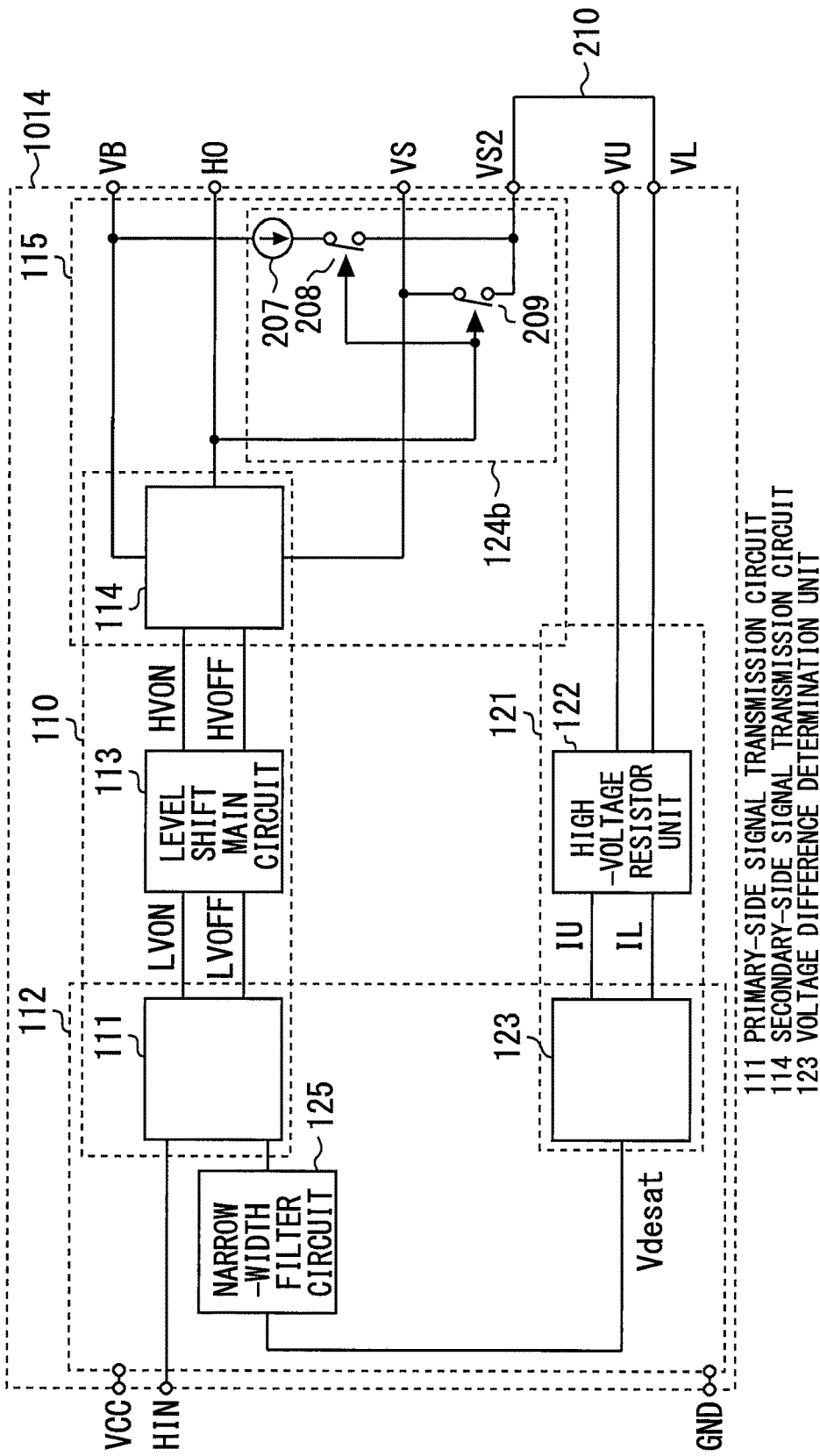
FIG. 11 is a circuit block diagram illustrating a semiconductor device driving integrated circuit according to a ninth embodiment of the present invention.

FIG. 11 is a circuit block diagram illustrating a semiconductor device driving integrated circuit 1014 (hereinafter also referred to simply as the integrated circuit 1014) according to a ninth embodiment of the present invention. In the integrated circuit 1014 according to the ninth embodiment, a noise filter function using the drive signal HO is implemented only by the secondary-side circuit 115, unlike in the eighth embodiment.

As illustrated in FIG. 11, in the integrated circuit 1014, a noise filter circuit 124b is provided in the secondary-side circuit 115. Further, the integrated circuit 1014 includes a terminal VS2 and a wire 210 that connects the terminal VS2 to the terminal VL. As a method for connecting the terminal VS2 to the terminal VL, the terminals may be connected by the wire 210 or the like outside the integrated circuit, or may be wired in the integrated circuit 1014.

The noise filter circuit 124b connects the emitter electrode to the second high-voltage resistor 202 during the ON period (HIGH period) of the drive signal HO, thereby supplying the second current IL to the voltage difference determination unit 123. Further, the noise filter circuit 124b connects a constant current circuit 207 to the second high-voltage resistor 202 during the OFF period (LOW period) of the drive signal HO, thereby supplying the voltage difference determination unit 123 with a current large enough to set the detection signal Vdesat to LOW. Specifically, the noise filter circuit 124b includes switches 208 and 209 and the constant current circuit 207. The switch 209 connects the terminal VS to the terminal VS2 when the drive signal HO is HIGH, and electrically disconnects (blocks) the terminal VS from the terminal VS2 when the drive signal HO is LOW. The switch 208 electrically disconnects (blocks) the constant current circuit 207 from the terminal VS2 when the drive signal HO is HIGH, and connects the constant current circuit 207 to the terminal VS2 when the drive signal HO is LOW. When the switch 208 is turned on, the current of the constant current circuit 207 is input to the high-voltage resistor unit 122 through the terminals VS2 and VL, and the second current IL is generated. When the constant current circuit 207 generates the second current IL, the voltage difference determination unit 123 preliminarily sets the current value of the constant current circuit 207 in such a manner that the detection signal Vdesat becomes LOW, i.e., the difference between the current IU and the current IL becomes sufficiently small.

When the drive signal HO is HIGH, the terminal VS is connected to the terminal VS2, so that the emitter voltage is input to the terminal VL through the terminal VS2. As a result, the detection signal Vdesat becomes HIGH during desaturation of the high-potential-side semiconductor switching device 102. When the drive signal HO is LOW, the constant current circuit 207 is connected to the terminal VS2, the constant current is input to the terminal VL through the terminal VS2, and the detection signal Vdesat is set to LOW. The circuit operation described above can prevent erroneous detection of the desaturation voltage when the drive signal HO is LOW.

According to the ninth embodiment, a reverse level shift of the drive signal HO from the secondary side to the primary side may be omitted, and a level shift of the desaturation voltage detection signal Vdesat from the primary side to the secondary side may be omitted. Consequently, an advantageous effect that the level shift operation associated with the noise filter using the drive signal HO can be reduced is also obtained.

Tenth Embodiment

Figure 12:
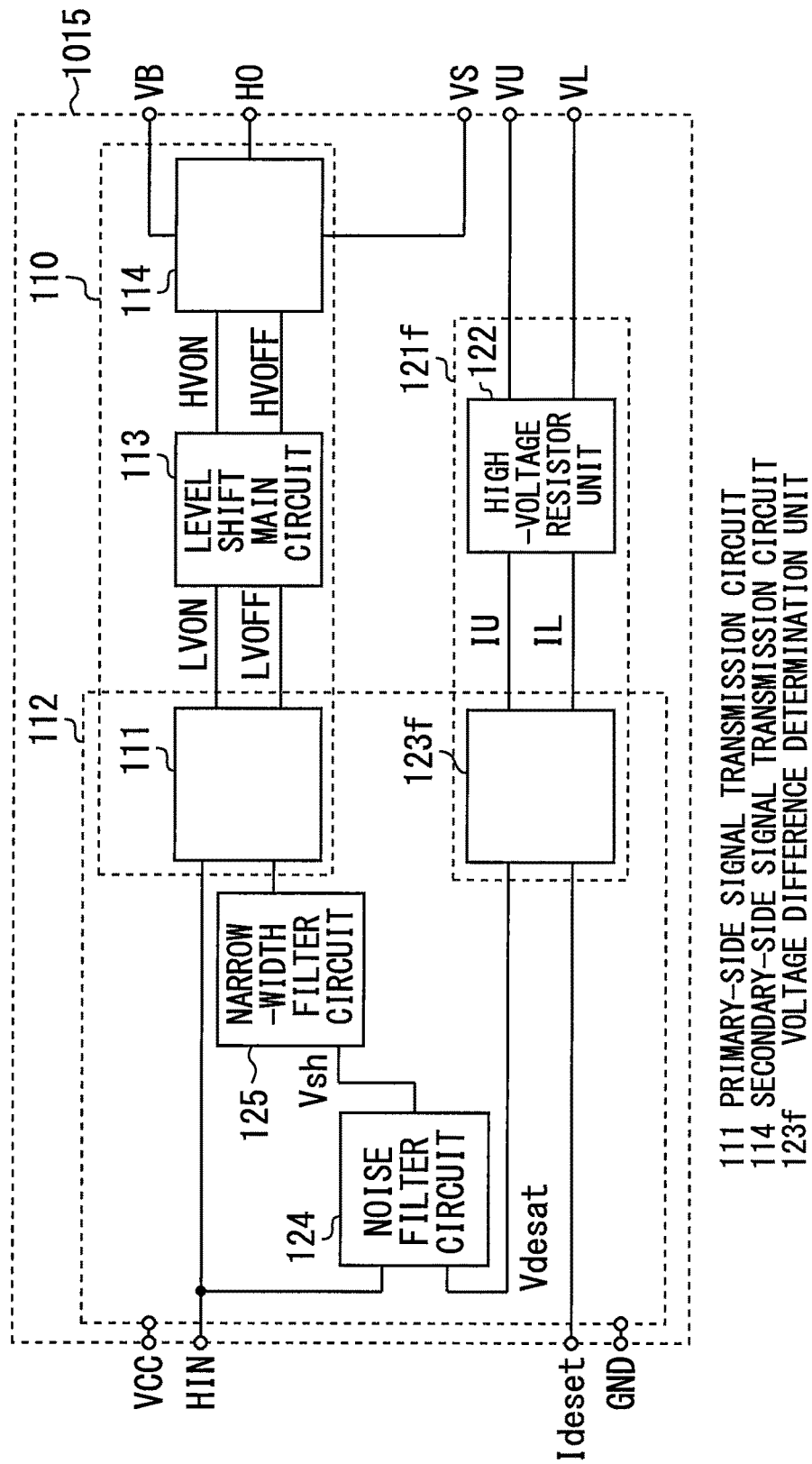
FIG. 12 is a circuit block diagram illustrating a semiconductor device driving integrated circuit according to a tenth embodiment of the present invention.
Figure 13:
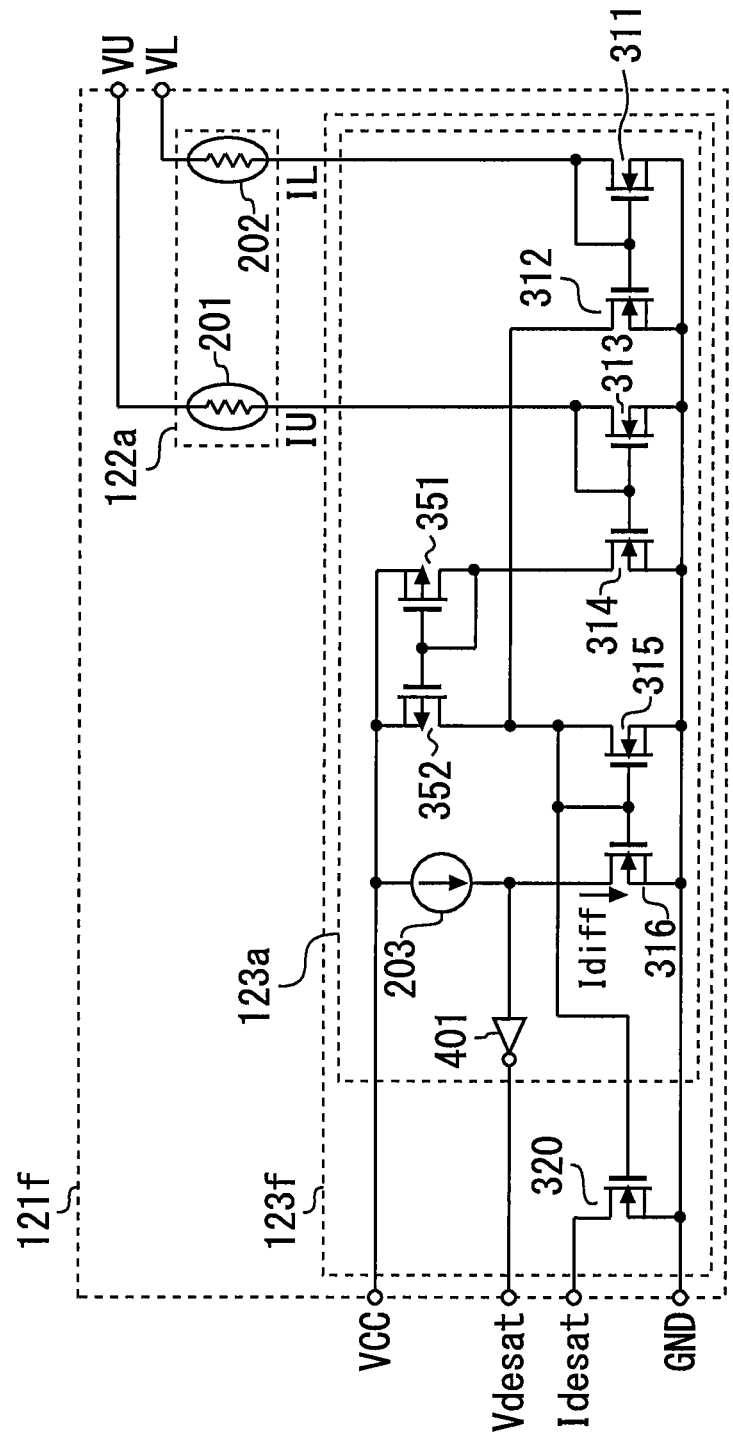
FIG. 13 is a circuit block diagram illustrating a semiconductor device driving integrated circuit according to a tenth embodiment of the present invention.

FIG. 12 is a circuit block diagram illustrating a semiconductor device driving integrated circuit 1015 (hereinafter also referred to simply as integrated circuit 1015) according to a tenth embodiment of the present invention. FIG. 13 is a circuit diagram illustrating a desaturation voltage detection circuit 121f of the integrated circuit 1015 according to the tenth embodiment of the present invention. In the tenth embodiment, the circuit configuration of the first embodiment is modified and the voltage difference signal (detection signal Vdesat) detected in the voltage difference determination unit 123a is output to the outside as an analog signal. The integrated circuit 1015 illustrated in FIG. 12 includes an analog signal terminal that is exposed to the outside of the integrated circuit 1015 and outputs an analog current signal Idesat. As the analog current signal Idesat, the current Idiff, which is the difference between the first current IU and the second current IL, is output to the outside of the integrated circuit 1015 as an analog value.

The desaturation voltage detection circuit 121f illustrated in FIG. 13 is characterized by the circuit configuration of the voltage difference determination unit 123f capable of outputting the analog current signal Idesat. The voltage difference determination unit 123f has a configuration in which an NMOSFET 320 is added to the voltage difference determination unit 123a (see FIG. 3) according to the first embodiment. The NMOSFET 320 and the NMOSFET 315 constitute a "ninth current mirror circuit", and a current obtained by duplicating the current Idiff flowing through the NMOSFET 316 is output to the NMOSFET 320. The drain of the NMOSFET 320 is connected to the analog signal terminal described above, and the current difference Idiff is output as the analog current signal Idesat.

While FIG. 13 illustrates a mode in which the current difference Idiff is output, the mode may be modified in such a manner that a voltage difference is output as an analog voltage signal. Note that in FIG. 12, the noise filter circuit 124 is provided, but instead the noise filter circuit 124 may be omitted so that an external circuit implements short-circuiting determination.

The detected voltage difference signal is output to the outside as the analog current signal Idesat, thereby making it possible to set a reference for determining the desaturation voltage on the outside of the integrated circuit 1015, and to arbitrarily set and change the control contend during desaturation voltage detection.

Eleventh Embodiment

Figure 14:
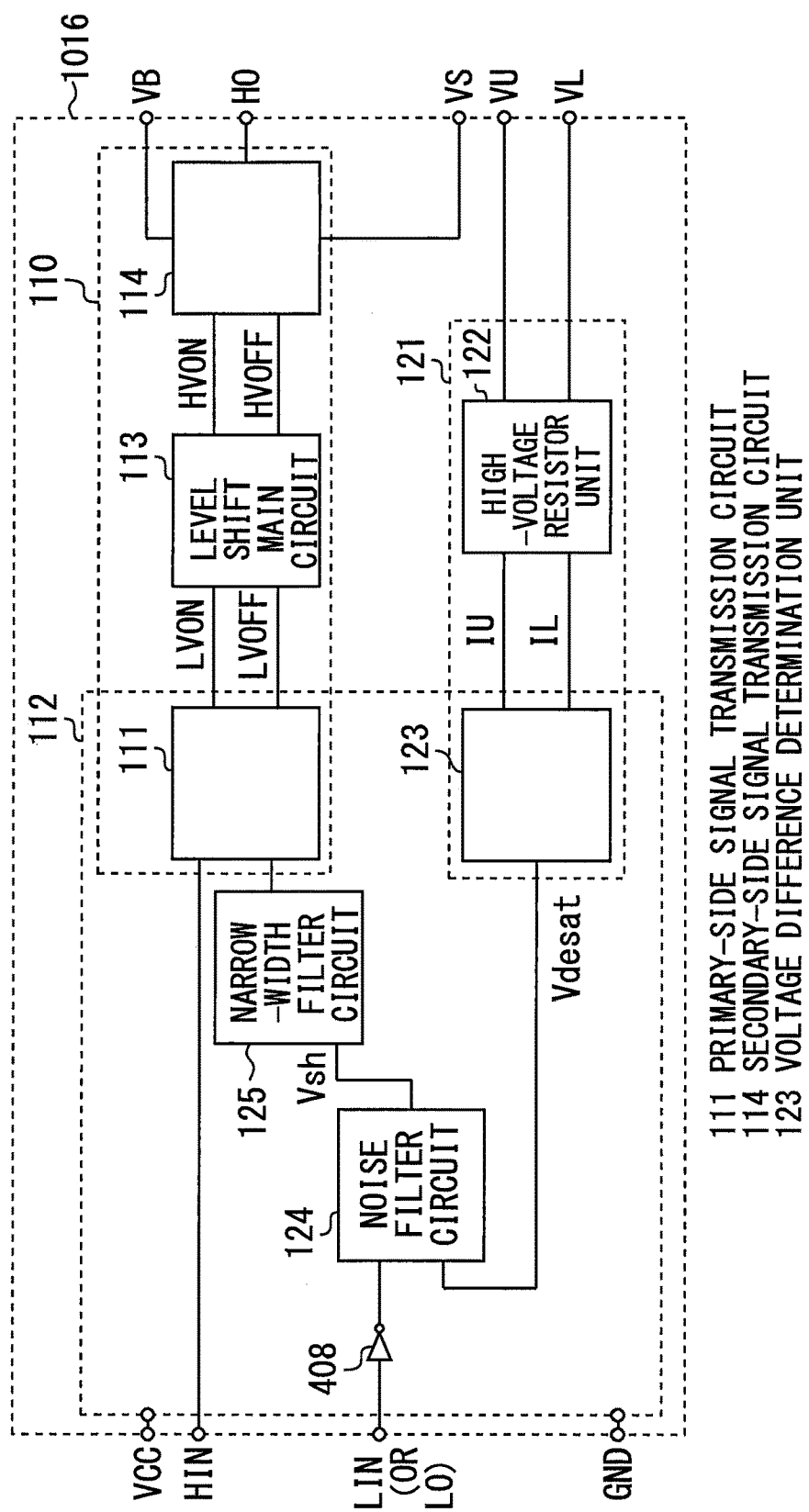
FIG. 14 is a circuit block diagram illustrating a semiconductor device driving integrated circuit according to an eleventh embodiment of the present invention.

FIG. 14 is a circuit block diagram illustrating a semiconductor device driving integrated circuit 1016 (hereinafter also referred to simply as the integrated circuit 1016) according to the eleventh embodiment of the present invention. The two semiconductor switching devices 102 and 103 are not simultaneously turned on so as to prevent short-circuiting. Accordingly, when the low-potential-side semiconductor switching device 103 is turned on, the high-potential-side semiconductor switching device 102 is originally supposed to be turned off. Accordingly, in the eleventh embodiment, the inverter device 900 and the integrated circuit 101 according to the first embodiment are used as a basic configuration, and erroneous detection of the desaturation voltage is prevented by inputting a low-potential-side input signal LIN or a low-potential-side drive signal LO to the noise filter circuit 124 of the integrated circuit 101.

In the integrated circuit 1016 illustrated in FIG. 14, the low-potential-side input signal LIN is input to the noise filter circuit 124 through an inverter 408. This configuration is different from the configuration in which the integrated circuit 101 illustrated in FIG. 1 inputs the high-potential-side input signal HIN to the noise filter circuit 124. The noise filter circuit 124 sets the detection signal Vsh to HIGH when the low-potential-side input signal LIN is LOW and the detection signal Vdesat is HIGH. Specifically, the noise filter circuit 124 filters the detection signal Vdesat in such a manner that the detection signal Vdesat is allowed to pass during the OFF period (LOW period) of the low-potential-side input signal LIN, and the detection signal Vdesat is blocked during the ON period (HIGH period) of the low-potential-side input signal LIN.

Instead of the low-potential-side input signal LIN, the low-potential-side drive signal LO may be input to the noise filter circuit 124. In this case, the noise filter circuit 124 filters the detection signal Vdesat in such a manner that the detection signal Vdesat is allowed to pass during the OFF period (LOW period) of the low-potential-side drive signal LO, and the detection signal Vdesat is blocked during the ON period (HIGH period) of the low-potential-side drive signal LO. If the low-potential-side drive signal LO is input to the noise filter circuit 124, erroneous detection can be prevented even when the drive signal LO operates in a manner different from that of the input signal LIN.

As described above, in the eleventh embodiment, the detection signal Vdesat of HIGH level is transmitted to the detection signal Vsh only when the low-potential-side drive signal LIN or the low-potential-side input signal LO is LOW. With this configuration, such an erroneous detection that the desaturation voltage due to an overcurrent is generated can be prevented even if the collector-emitter voltage is expanded in the high-potential-side semiconductor switching device 102 in the OFF state when the low-potential-side semiconductor switching device 103 is turned on.

Twelfth Embodiment

Figure 21:
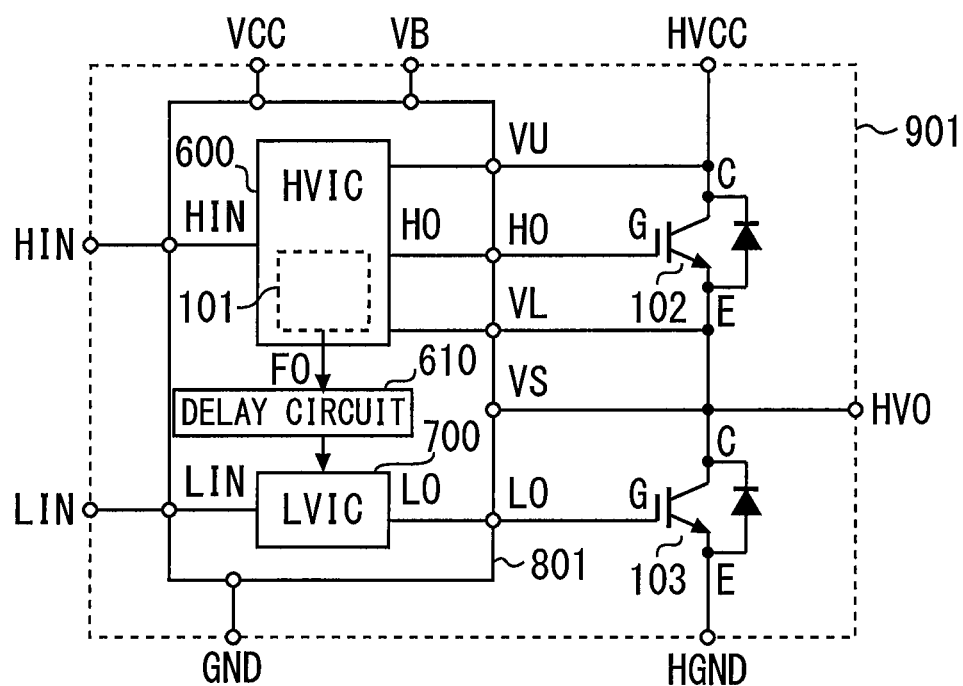
FIG. 21 is a circuit diagram illustrating an inverter device according to a twelfth embodiment of the present invention.

FIG. 21 is a circuit diagram illustrating an inverter device 901 according to a twelfth embodiment of the present invention. In the inverter device 901 according to the twelfth embodiment, a circuit configuration similar to that of the inverter device 900 is used as a basic configuration, and switching off control upon occurrence of short-circuiting is improved. Specifically, the HVIC 600 and the LVIC 700 are configured in such a manner that the detection signal Vdesat is output after an overcurrent is generated due to short-circuiting, and after that, turning off of the high-potential-side semiconductor switching device 102 and turning off of the low-potential-side semiconductor switching device 103 are performed at different timings.

If both the high-potential-side semiconductor switching device 102 and the low-potential-side semiconductor switching device 103 are in the ON state and short-circuited in the inverter device 900 according to the first embodiment, when the high-potential-side semiconductor switching device 102 and the low-potential-side semiconductor switching device 103 are simultaneously turned off, di/dt increases and the integrated circuit and the switching device may be destroyed due to surge. Accordingly, in the twelfth embodiment, an increase in di/dt during the OFF operation is suppressed by turning off the high-potential-side semiconductor switching device 102 and the low-potential-side semiconductor switching device 103 in an order of priority after desaturation voltage detection. Specifically, it is preferably to preferentially turn off one of the high-potential-side semiconductor switching device 102 and the low-potential-side semiconductor switching device 103 that is turned on after the other one of the devices is turned on because the device that is turned on after the other one of the devices is turned on has a lower gate voltage and smaller di/dt during the OFF operation.

After desaturation voltage detection, a difference in timing for turning off the two semiconductor switching devices 102 and 103 can be produced by various methods. FIG. 21 illustrates an example in which a drive module 801 which is obtained by modifying the drive module 800 is provided, and the drive module 801 transmits an error signal FO, which triggers the OFF operation after desaturation voltage detection, to the LVIC 600, while the delay circuit 610 delays the error signal, thereby producing the timing difference. The example of FIG. 21 illustrates a case where the high-potential-side semiconductor switching device 102 is first turned off. However, this circuit is merely an example. The low-potential-side semiconductor switching device 103 may be first turned off. One of the high-potential-side semiconductor switching device 102 and the low-potential-side semiconductor switching device 103 that is turned on after the other one of the devices is turned on may be detected and turned off preferentially. Alternatively, the timing difference may be produced by monitoring the VS potential from a first OFF operation and performing a second OFF operation after the VS potential changes to a predetermined voltage. To implement such an operation, a timing signal for recognizing the timing of the OFF operation may be transmitted or received between the HVIC 600 and the LVIC 700, and the error signal FO or the detection signal Vdesat itself can be transmitted to the LVIC 700.

Figure 16:
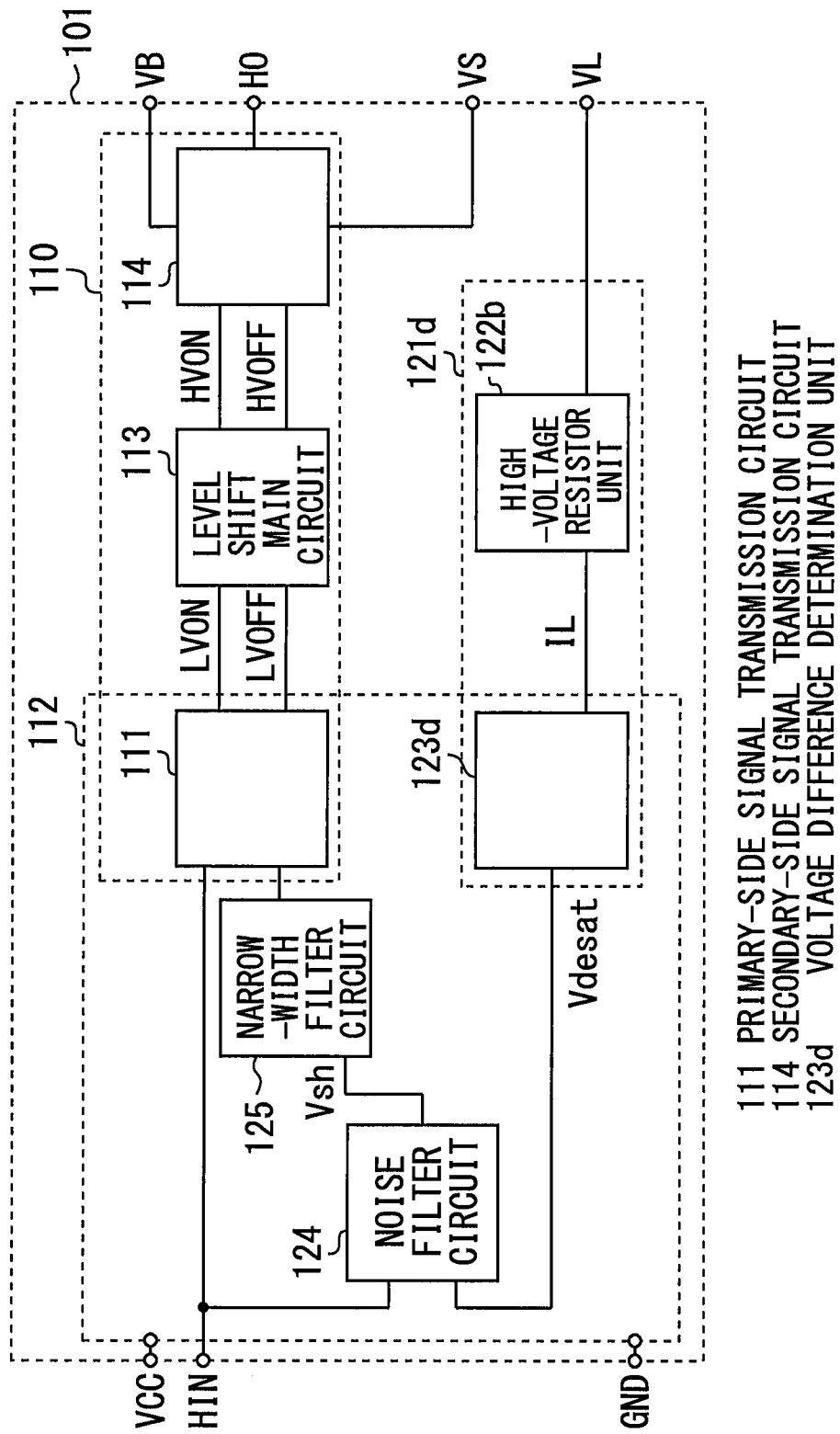
FIG. 16 is a circuit diagram illustrating an example of the semiconductor device driving integrated circuit to which the desaturation voltage detection circuit according to the fifth embodiment of the present invention is applied.
Figure 17:
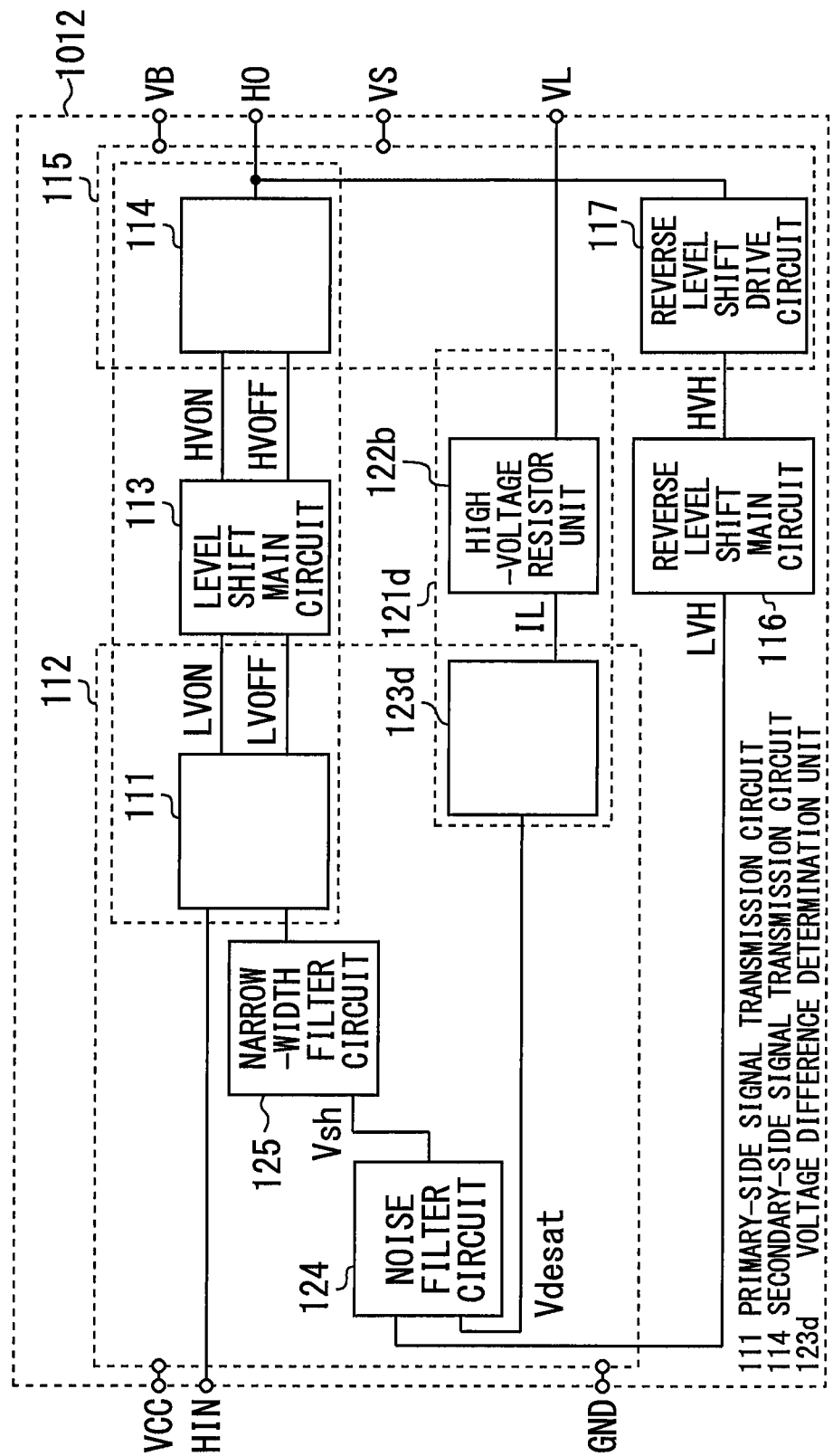
FIG. 17 is a circuit diagram illustrating an example of the semiconductor device driving integrated circuit to which the desaturation voltage detection circuit according to the fifth embodiment of the present invention is applied.
Figure 18:
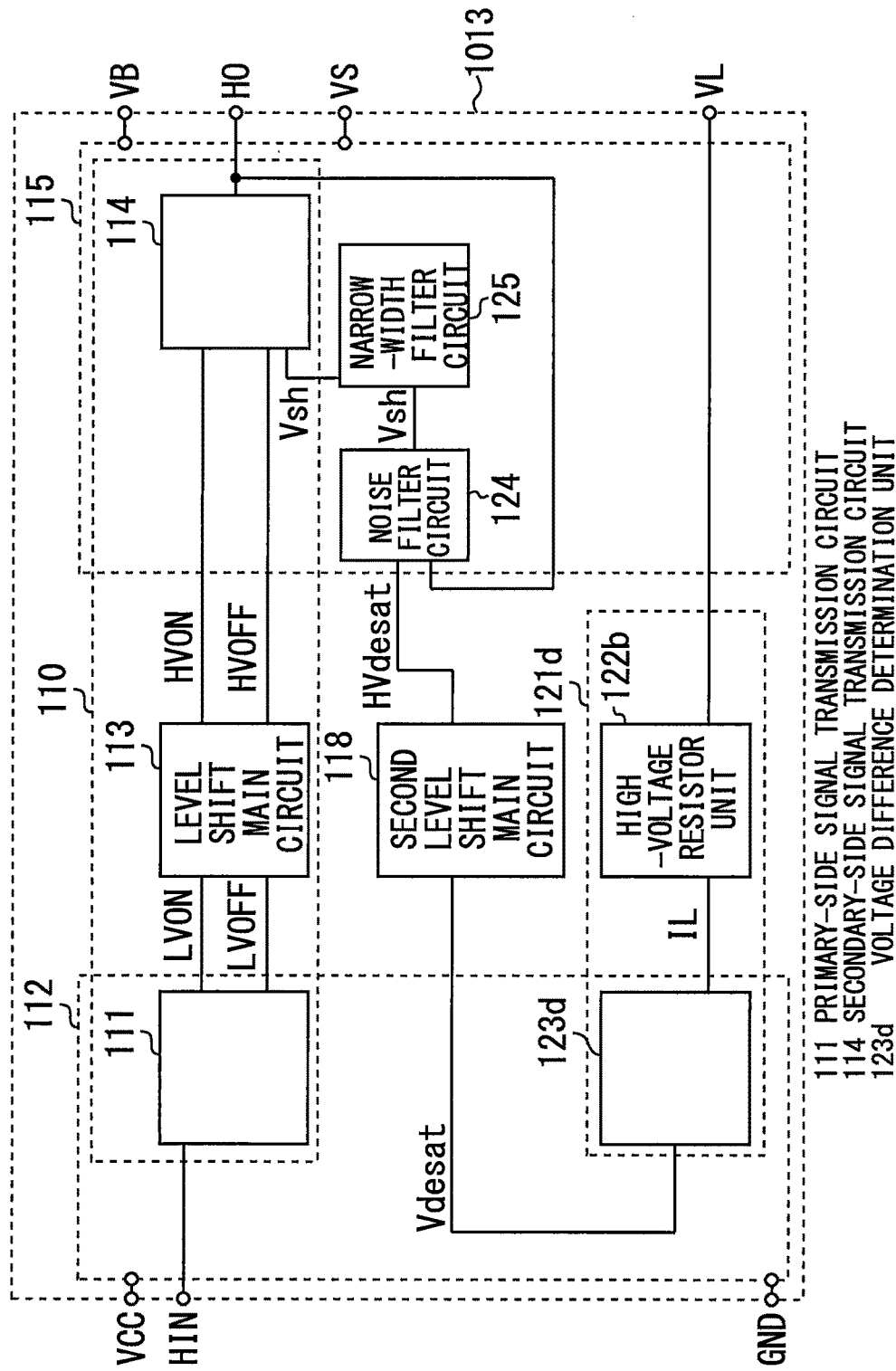
FIG. 18 is a circuit diagram illustrating an example of the semiconductor device driving integrated circuit to which the desaturation voltage detection circuit according to the fifth embodiment of the present invention is applied.
Figure 19:
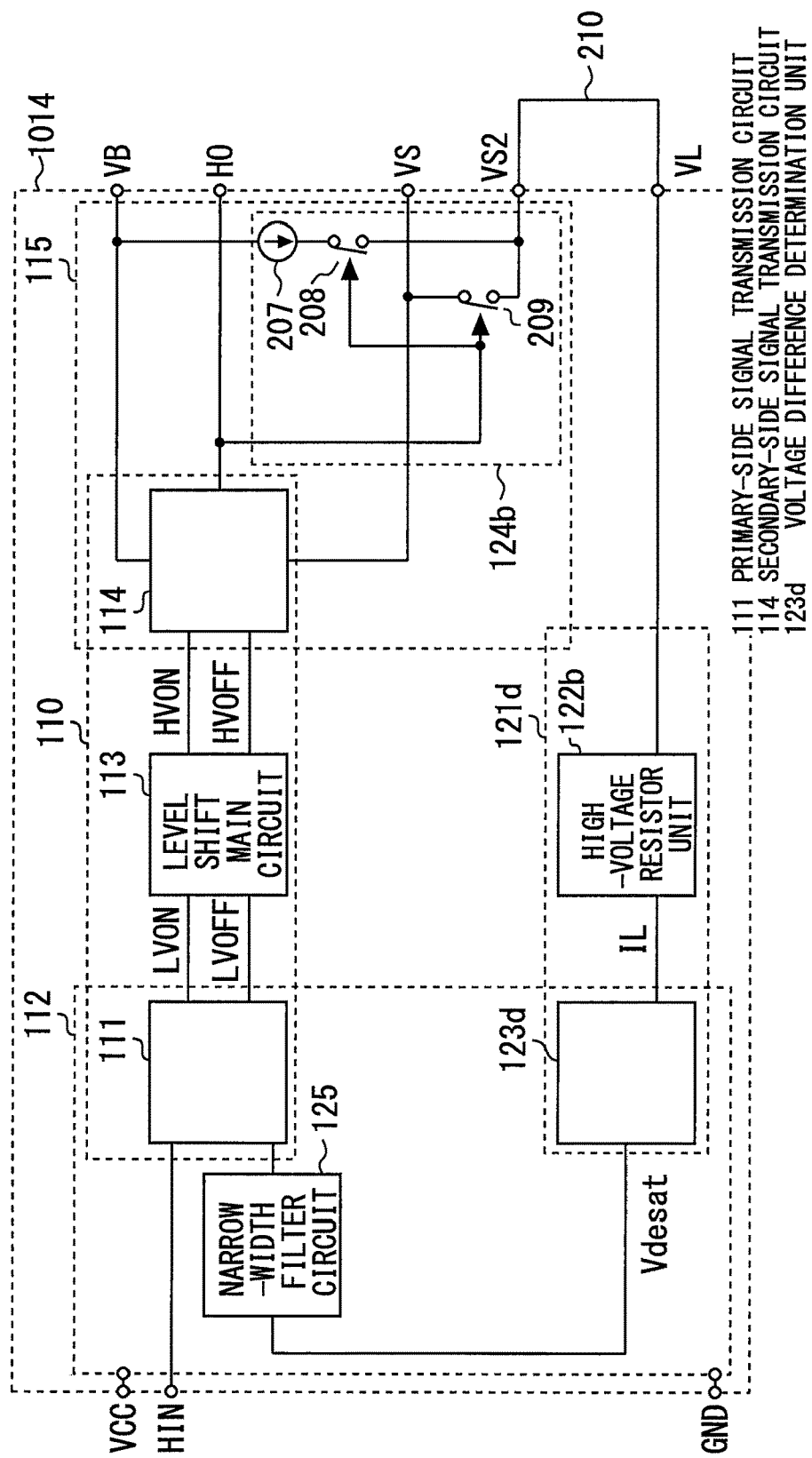
FIG. 19 is a circuit diagram illustrating an example of the semiconductor device driving integrated circuit to which the desaturation voltage detection circuit according to the fifth embodiment of the present invention is applied.
Figure 20:
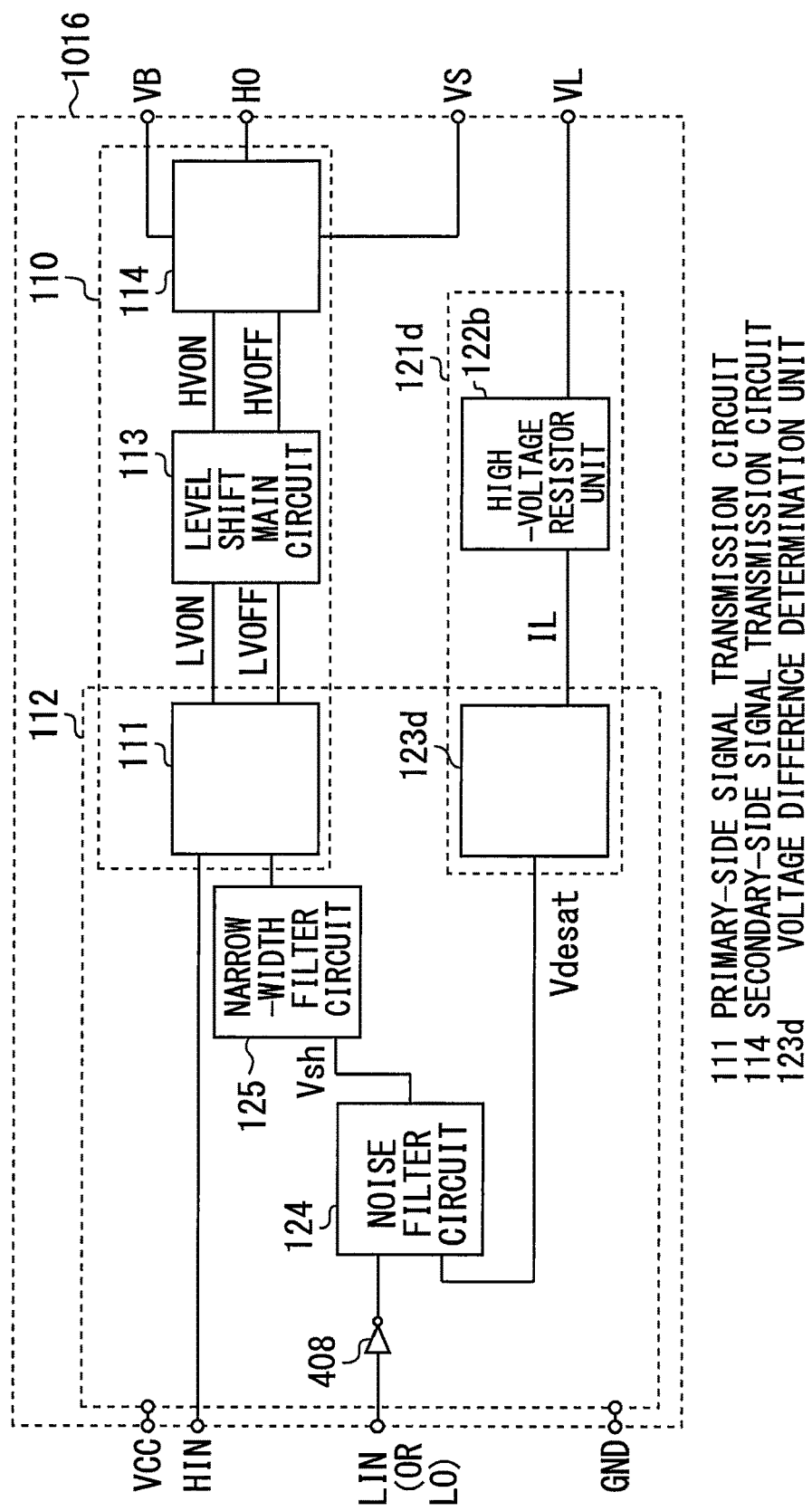
FIG. 20 is a circuit diagram illustrating an example of the semiconductor device driving integrated circuit to which the desaturation voltage detection circuit according to the fifth embodiment of the present invention is applied.

Note that the semiconductor device driving integrated circuit and the inverter device according to the embodiments described above can also be configured using the desaturation voltage detection circuit 121d according to the fifth embodiment. FIGS. 16 to 20 are circuit diagrams each illustrating an example of the semiconductor device driving integrated circuit to which the desaturation voltage detection circuit 121d according to the fifth embodiment of the present invention is applied. FIG. 16 illustrates a configuration in which the desaturation voltage detection circuit 121d is applied to the integrated circuit 101 illustrated in FIG. 1. FIG. 17 illustrates a configuration in which the desaturation voltage detection circuit 121d is applied to the integrated circuit 1012 illustrated in FIG. 9. FIG. 18 illustrates a configuration in which the desaturation voltage detection circuit 121d is applied to the integrated circuit 1013 illustrated in FIG. 10. FIG. 19 illustrates a configuration in which the desaturation voltage detection circuit 121d is applied to the integrated circuit 1014 illustrated in FIG. 11. FIG. 20 illustrates a configuration in which the desaturation voltage detection circuit 121d is applied to the integrated circuit 1016 illustrated in FIG. 14. In the drawings, the illustration of the terminal VU is omitted. Although not illustrated, the error signal terminal FO illustrated in FIG. 15 may be applied to the integrated circuit 101 illustrated in FIG. 16.

REFERENCE SIGNS LIST

101~1016 Semiconductor device driving integrated circuit (integrated circuit)
102 high-potential-side semiconductor switching device
103 low-potential-side semiconductor switching device
110 level shift unit
111 primary-side signal transmission circuit
112 primary-side circuit
113 level shift main circuit
114 secondary-side signal transmission circuit
115 secondary-side circuit
118 second level shift main circuit
121~121f desaturation voltage detection circuit
122~122b high-voltage resistor unit
123~123f voltage difference determination unit
124~124b noise filter circuit
125 narrow-width filter circuit
126b, 126d determination limiting unit
116 reverse level shift main circuit
117 reverse level shift drive circuit
201 first high-voltage resistor
202 second high-voltage resistor
203~207 constant current circuit
208,209 switch
210 wire
401, 403~408 inverter
402 AND circuit
600 high-potential-side driving circuit (HVIC)
610 delay circuit
700 low-potential-side driving circuit (LVIC)
800, 801 drive module
900 inverter device
FO error signal terminal
GND first reference potential
VS second reference potential
HGND third reference potential
HIN input signal (high-potential-side input signal)
LIN input signal (low-potential-side input signal)
HO driving signal (high-potential-side driving signal)
LO driving signal (low-potential-side driving signal)
HVdesat high-potential-side detection signal
Idesat analog current signal
Idiff current (current difference)
VCC first power supply voltage
VB second power supply voltage
HVCC third power supply voltage
Vdesat, Vsh detection signal

The invention claimed is:

1. A semiconductor device drive circuit for driving a semiconductor switching device including a first electrode, a second electrode, and a control electrode that controls an electrical connection between the first electrode and the second electrode, the semiconductor device drive circuit comprising:
an input terminal that receives an input signal;
a level shift unit that shifts a voltage level of the input signal and outputs a drive signal to be supplied to the control electrode;
a first resistor that generates a first current from a first voltage applied to the first electrode;
a second resistor that generates a second current from a second voltage applied to the second electrode; and
a determination unit that outputs a detection signal when a difference between the first current and the second current is equal to or greater than a predetermined desaturation determination value,
wherein the level shift unit, the first resistor, the second resistor, and the determination unit are provided in a single integrated circuit chip.

2. The semiconductor device drive circuit according to claim 1, further comprising a determination limiting unit connected to the determination unit and configured to selectively transmit the detection signal in such a manner that the detection signal is allowed to pass when a value of the difference is equal to or less than an upper limit value preliminarily set to be greater than the desaturation determination value, and the detection signal is blocked when the difference exceeds the upper limit value.

3. The semiconductor device drive circuit according to claim 2, wherein the upper limit value is adjusted to a larger value as the first voltage increases.

4. The semiconductor device drive circuit according to claim 1, further comprising a determination limiting unit connected to the determination unit and configured to selectively transmit the detection signal in such a manner that the detection signal is allowed to pass when the second voltage is higher than a predetermined OFF corresponding value, and the detection signal is blocked when the second voltage is equal to or less than the OFF corresponding value.

5. The semiconductor device drive circuit according to claim 1, wherein
the input signal includes an ON period indicating ON of the semiconductor switching device, and an OFF period indicating OFF of the semiconductor switching device, and
the semiconductor device drive circuit further comprises a noise filter circuit that receives the input signal and filters the detection signal in such a manner that the detection signal is allowed to pass during the ON period of the input signal and the detection signal is blocked during the OFF period of the input signal.

6. The semiconductor device drive circuit according to claim 1, wherein
the drive signal includes an ON period in which the semiconductor switching device is turned on, and an OFF period in which the semiconductor switching device is turned off, and
the semiconductor device drive circuit further comprises a noise filter circuit that receives the drive signal and filters the detection signal in such a manner that the detection signal is allowed to pass during the ON period of the drive signal and the detection signal is blocked during the OFF period of the drive signal.

7. The semiconductor device drive circuit according to claim 6, wherein
the level shift unit includes:

a primary-side signal transmission circuit that outputs a first voltage level signal according to the input signal;
a first level shift main circuit that shifts a voltage level of the first voltage level signal and generates a second voltage level signal; and
a secondary-side signal transmission circuit that receives the second voltage level signal and generates the drive signal,
the semiconductor device drive circuit further comprises a second level shift main circuit that generates a high-potential detection signal obtained by shifting a voltage level of the detection signal,
the high-potential detection signal whose level has been shifted by the second level shift main circuit is input to the noise filter circuit, and
the secondary-side signal transmission circuit sets the drive signal to a value at which the semiconductor switching device is turned off, upon receiving the filtered detection signal having passed through the noise filter circuit.

8. The semiconductor device drive circuit according to claim 1, wherein
the drive signal includes an ON period in which the semiconductor switching device is turned on, and an OFF period in which the semiconductor switching device is turned off, and
the semiconductor device drive circuit further comprises a noise filter circuit that receives the drive signal, connects the second electrode to the second resistor during the ON period of the drive signal to supply the determination unit with the second current, and connects a constant current circuit to the second resistor during the OFF period of the drive signal to supply the determination unit with a current large enough to prevent the detection signal from being output.

9. The semiconductor device drive circuit according to claim 1, further comprising an error signal terminal that is exposed to an outside of the semiconductor device drive circuit, and outputs an error signal in response to the detection signal.

10. The semiconductor device drive circuit according to claim 1, further comprising an analog detection signal terminal that is exposed to an outside of the semiconductor device drive circuit, and outputs a difference between the first current and the second current as an analog value.

11. A semiconductor device drive circuit for driving a semiconductor switching device including a first electrode, a second electrode, and a control electrode that controls an electrical connection between the first electrode and the second electrode, the semiconductor device drive circuit comprising:
an input terminal that receives an input signal;
a level shift unit that shifts a voltage level of the input signal and outputs a drive signal to be supplied to the control electrode;
a constant current circuit that generates a preliminarily set predetermined current;
a resistor that generates a detection current from a voltage applied to the second electrode;
a determination unit that outputs a detection signal when the detection current is less than the predetermined current; and
a circuit that is configured to selectively pass the detection signal in such a manner that the detection signal is allowed to pass during a first condition and is blocked from passing during a second condition.

12. The semiconductor device drive circuit according to claim 11, wherein the circuit comprises a determination limiting unit connected to the determination unit and configured to selectively transmit the detection signal in such a manner that the detection signal is allowed to pass during the first condition which is when the voltage applied to the second electrode is higher than a predetermined OFF corresponding value, and the detection signal is blocked during the second condition which is when the voltage applied to the second electrode is equal to or less than the OFF corresponding value.

13. The semiconductor device drive circuit according to claim 11, wherein
the input signal includes an ON period indicating ON of the semiconductor switching device, and an OFF period indicating OFF of the semiconductor switching device,
the circuit further comprises a noise filter circuit that receives the input signal and filters the detection signal in such a manner that the detection signal is allowed to pass during the first condition which is the ON period of the input signal and the detection signal is blocked during the second condition which is the OFF period of the input signal.

14. The semiconductor device drive circuit according to claim 11, wherein
the drive signal includes an ON period in which the semiconductor switching device is turned on, and an OFF period in which the semiconductor switching device is turned off, and
the circuit further comprises a noise filter circuit that receives the drive signal and filters the detection signal in such a manner that the detection signal is allowed to pass during the first condition which is the ON period of the drive signal and the detection signal is blocked during the second condition which is the OFF period of the drive signal.

15. The semiconductor device drive circuit according to claim 14, wherein
the level shift unit includes:
a primary-side signal transmission circuit that outputs a first voltage level signal according to the input signal;
a first level shift main circuit that shifts a voltage level of the first voltage level signal and generates a second voltage level signal; and
a secondary-side signal transmission circuit that receives the second voltage level signal and generates the drive signal; and
a second level shift main circuit that generates a high-potential detection signal obtained by shifting the voltage level of the detection signal, wherein
the detection signal whose level has been shifted by the second level shift main circuit is input to the noise filter circuit, and
the secondary-side signal transmission circuit sets the drive signal to a value at which the semiconductor switching device is turned off, upon receiving the filtered detection signal having passed through the noise filter circuit.

16. The semiconductor device drive circuit according to claim 11, wherein
the drive signal includes an ON period in which the semiconductor switching device is turned on, and an OFF period in which the semiconductor switching device is turned off, and
the circuit further comprises a noise filter circuit that receives the drive signal, connects the second electrode to the resistor during the ON period of the drive signal to supply the determination unit with the detection current, and connects the constant current circuit to the resistor during the second condition which is the OFF period of the drive signal to supply the determination unit with a current large enough to prevent the detection signal from being output.

17. The semiconductor device drive circuit according to claim 11, further comprising an error signal terminal that is exposed to an outside of the semiconductor device drive circuit, and outputs an error signal in response to the detection signal.

18. An inverter device comprising:
a high-potential-side semiconductor switching device including a first electrode, a second electrode, and a first control electrode that controls an electrical connection between the first electrode and the second electrode;
a low-potential-side semiconductor switching device including a third electrode connected to the second electrode, a fourth electrode, and a second control electrode that controls an electrical connection between the third electrode and the fourth electrode;
a first semiconductor device drive circuit that drives the high-potential-side semiconductor switching device; and
a second semiconductor device drive circuit that drives the low-potential-side semiconductor switching device, wherein
the first semiconductor device drive circuit includes:
an input terminal that receives an input signal;
a level shift unit that shifts a voltage level of the input signal, and outputs a drive signal to be supplied to the first control electrode;
a first resistor that generates a first current from a first voltage applied to the first electrode;
a second resistor that generates a second current applied to the second electrode; and
a determination unit configured to output a detection signal when a difference between the first current and the second current is equal to or greater than a predetermined desaturation determination value, and
the level shift unit, the first resistor, the second resistor, and the determination unit are incorporated in a single integrated circuit chip.

19. The inverter device according to claim 18, wherein
a low-potential-side input signal is input to an input terminal of the second semiconductor device drive circuit,
the low-potential-side input signal includes an ON period indicating ON of the low-potential-side semiconductor switching device, and an OFF period indicating OFF of the low-potential-side semiconductor switching device, and
the inverter device further comprises a noise filter circuit that receives the low-potential-side input signal and filters the detection signal in such a manner that the detection signal is allowed to pass during the OFF period of the low-potential-side input signal and the detection signal is blocked during the ON period of the low-potential-side input signal.

20. The inverter device according to claim 18, wherein
a low-potential-side drive signal is input to the second control electrode,
the low-potential-side drive signal includes an ON period in which the low-potential-side semiconductor switching device is turned on, and an OFF period in which the low-potential-side semiconductor switching device is turned off, and
the inverter device further comprises a noise filter circuit that receives the low-potential-side drive signal and filters the detection signal in such a manner that the detection signal is allowed to pass during the OFF period of the low-potential-side drive signal and the detection signal is blocked during the ON period of the low-potential-side drive signal.

21. The inverter device according to claim 18, wherein the first semiconductor device drive circuit and the second semiconductor device drive circuit turn off the high-potential-side semiconductor switching device and turn off the low-potential-side semiconductor switching device at different timings after the detection signal is output.

22. An inverter device comprising:
a high-potential-side semiconductor switching device including a first electrode, a second electrode, and a first control electrode that controls an electrical connection between the first electrode and the second electrode;
a low-potential-side semiconductor switching device including a third electrode connected to the second electrode, a fourth electrode, and a second control electrode that controls an electrical connection between the third electrode and the fourth electrode;
a first semiconductor device drive circuit that drives the high-potential-side semiconductor switching device; and
a second semiconductor device drive circuit that drives the low-potential-side semiconductor switching device, wherein
the first semiconductor device drive circuit includes:
an input terminal that receives an input signal;
a level shift unit that shifts a voltage level of the input signal, and outputs a drive signal to be supplied to the first control electrode;
a constant current circuit that generates a preliminarily set predetermined current;
a resistor that generates a detection current from a voltage applied to the second electrode;
a determination unit that outputs a detection signal when the detection current is less than the predetermined current; and
a circuit that is configured to selectively pass the detection signal in such a manner that the detection signal is allowed to pass during a first condition and is blocked from passing during a second condition.

* * * * *